(12) United States Patent
Chiang et al.

(10) Patent No.: US 12,349,447 B2
(45) Date of Patent: Jul. 1, 2025

(54) STRUCTURE AND FORMATION METHOD OF SEMICONDUCTOR DEVICE WITH DIELECTRIC FIN

(71) Applicant: Taiwan Semiconductor Manufacturing Company, Ltd., Hsinchu (TW)

(72) Inventors: Hsin-Che Chiang, Taipei (TW); Wei-Chih Kao, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 17/865,109

(22) Filed: Jul. 14, 2022

(65) Prior Publication Data

US 2024/0021480 A1    Jan. 18, 2024

(51) Int. Cl.
*H10D 84/01* (2025.01)
*H10D 84/03* (2025.01)
*H10D 84/83* (2025.01)

(52) U.S. Cl.
CPC ....... *H10D 84/038* (2025.01); *H10D 84/0151* (2025.01); *H10D 84/0158* (2025.01); *H10D 84/834* (2025.01)

(58) Field of Classification Search
CPC ............. H10D 84/038; H10D 84/0151; H10D 84/0158; H10D 84/834

USPC .......................................................... 257/401
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 11,171,143 B2 * | 11/2021 | Liaw .................... | H10D 64/017 |

* cited by examiner

*Primary Examiner* — Monica D Harrison
(74) *Attorney, Agent, or Firm* — Birch, Stewart, Kolasch & Birch, LLP

(57) ABSTRACT

A semiconductor device structure and a formation method are provided. The method includes forming a first dielectric fin and a second dielectric fin over a substrate, and the second dielectric fin is taller than the first dielectric fin. The method also includes forming a gate stack over the substrate, and the gate stack extends across the first dielectric fin and the second dielectric fin. The method further includes partially removing the gate stack such that an opening exposing the second dielectric fin is formed and forming an isolation structure in the opening.

20 Claims, 20 Drawing Sheets

STRUCTURE AND FORMATION METHOD OF SEMICONDUCTOR DEVICE WITH DIELECTRIC FIN

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
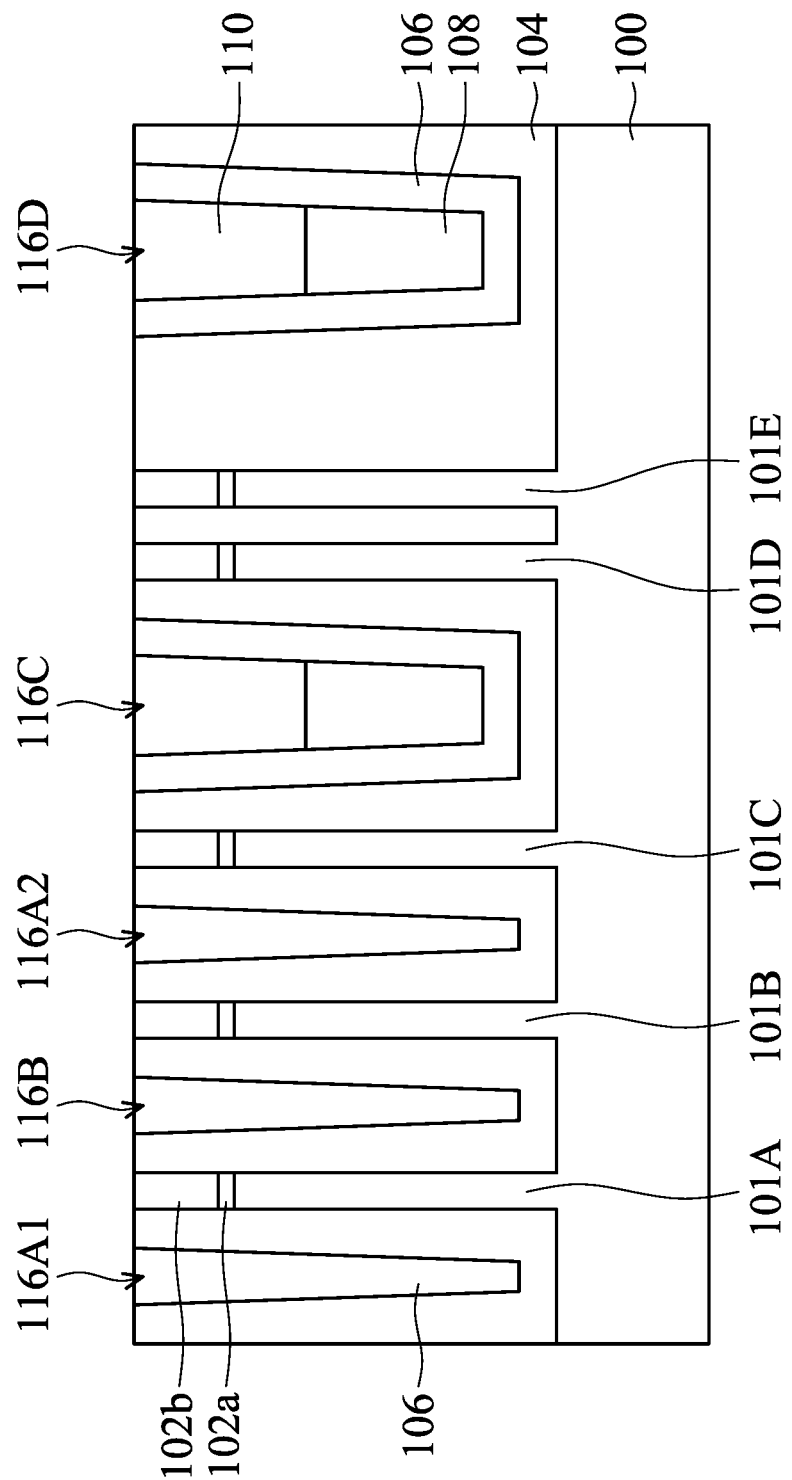
FIGS. 1A-1J are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a portion of a semiconductor device structure, in accordance with some embodiments. As shown in FIG. 1A, a substrate such as a semiconductor substrate 100 is received or provided. The semiconductor substrate 100 includes multiple regions. In some embodiments, these regions are designed for forming different devices. In some embodiments, the region shown in FIG. 1A is designed for forming logic devices and/or input/output (IO) devices.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of or include silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Another suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple semiconductor structures such as semiconductor protruding structures 101A-101E are formed over the semiconductor substrate 100, in accordance with some embodiments. In some other embodiments, one or more of the semiconductor protruding structures 101A-101E include a stack of two or more different semiconductor layers that are laid out alternately, which may be used for forming gate-all-around (GAA) devices.

In some embodiments, multiple recesses (or trenches) are formed in the semiconductor substrate 100, in accordance with some embodiments. As a result, multiple semiconductor protruding structures that protrude from the surface of the semiconductor substrate 100 are formed or defined between the recesses. In some embodiments, one or more photolithography and etching processes are used to form the recesses. In some embodiments, the semiconductor protruding structures $101A_{-101E}$ directly connect to the semiconductor substrate 100.

However, embodiments of the disclosure have many variations and/or modifications. In some other embodiments, the semiconductor protruding structures 101A-101E are not in direct contact with the semiconductor substrate 100. One or more other material layers may be formed between the semiconductor substrate 100 and the semiconductor protruding structures 101A-101E. For example, a dielectric layer may be formed therebetween.

In some embodiments, hard mask elements are formed over the semiconductor substrate 100 to assist in the formation of the semiconductor protruding structures 101A-101E. One or more etching processes may be used to pattern the semiconductor substrate 100 into the semiconductor protruding structures 101A-101E, as shown in FIG. 1A.

Each of the hard mask elements may include a first mask layer 102a and a second mask layer 102b. The first mask layer 102a and the second mask layer 102b may be made of different materials. The first mask layer 102a may be made of or include silicon oxide, germanium oxide, silicon germanium oxide, one or more other suitable materials, or a combination thereof. The second mask layer 102b may be made of or include silicon nitride, silicon oxynitride, silicon carbide, one or more other suitable materials, or a combination thereof. Alternatively, the first mask layer 102a may be made of or include silicon nitride, silicon oxynitride, silicon carbide, one or more other suitable materials, or a combination thereof. The second mask layer 102b may be made of or include silicon oxide, germanium oxide, silicon germanium oxide, one or more other suitable materials, or a combination thereof.

Afterwards, an insulating layer 104 is deposited over the semiconductor substrate 100 and the semiconductor protruding structures 101A-101E, in accordance with some embodiments. In some embodiments, the insulating layer 104 extends along the tops and the sidewalls of the semiconductor protruding structures 101A-101E. In some embodiments, the insulating layer 104 conformally extends along the semiconductor protruding structures 101A-101E. In some embodiments, the insulating layer 104 is in direct contact with the semiconductor protruding structures 101A-101E.

In some embodiments, the insulating layer 104 is made of or includes a dielectric material. The dielectric material may include silicon oxide, carbon-containing silicon oxide, silicon carbide, silicon oxynitride, silicon nitride, one or more other suitable materials, or a combination thereof. In some other embodiments, the insulating layer 104 is substantially free of nitrogen. In these cases, the insulating layer 104 may be made of or include silicon oxide, carbon-containing silicon oxide, silicon carbide, one or more other suitable materials, or a combination thereof.

The insulating layer 104 may be deposited using a chemical vapor deposition (CVD) process, an atomic layer deposition (ALD) process, a thermal oxidation process, a physical vapor deposition (PVD) process, one or more other applicable processes, or a combination thereof. In some embodiments, the insulating layer 104 extends conformally along the sidewalls of the semiconductor protruding structures 101A-101E and the surface of the semiconductor substrate 100. The insulating layer 104 may not be deposited using a flowable chemical vapor deposition (FCVD) process.

Afterwards, a dielectric layer 106 is deposited over the insulating layer 104, in accordance with some embodiments. In some embodiments, the dielectric layer 106 extends along the sidewalls and the tops of the semiconductor protruding structures 101A-101E. In some embodiments, the dielectric layer 106 conformally extends along the semiconductor protruding structures 101A-101E.

In some embodiments, the dielectric layer 106 is made of or includes a dielectric material. In some embodiments, the dielectric material contains nitrogen and/or carbon. The dielectric material may include carbon-containing silicon nitride, carbon-containing silicon oxynitride, silicon carbide, silicon oxynitride, silicon nitride, one or more other suitable materials, or a combination thereof. The dielectric layer 106 may be deposited using an ALD process, a CVD process, one or more other applicable processes, or a combination thereof.

As shown in FIG. 1A, the trench between the semiconductor protruding structures 101B and 101C is narrower than the trench between the semiconductor protruding structures 101C and 101D. In some embodiments, the dielectric layer 106 substantially fills the remaining space of the narrower trench between the semiconductor protruding structures 101B and 101C while the dielectric layer 106 partially fills the trench between the semiconductor protruding structures 101C and 101D.

Afterwards, a dielectric layer 108 is deposited over the dielectric layer 106 to overfill the wider trench, in accordance with some embodiments. In some embodiments, the dielectric layer 108 is made of or includes silicon oxide, silicon oxynitride, silicon carbide, carbon-containing silicon oxide, one or more other suitable materials, or a combination thereof. The dielectric layer 108 may be deposited using an ALD process, a CVD process, an FCVD process, one or more other applicable processes, or a combination thereof.

Afterwards, a planarization process is performed to remove the dielectric layers outside of the trenches, in accordance with some embodiments. The planarization process may include a chemical mechanical polishing (CMP) process, a grinding process, a dry polishing process, an etching process, one or more other applicable processes, or a combination thereof.

Afterwards, upper portions of the dielectric layer 108 are removed, in accordance with some embodiments. As a result, recesses are formed. A protective material is then formed to overfill the recess, and a planarization process is used to remove the portion of the protective material outside of the recess. The remaining portion of the protective material forms protective elements 110, as shown in FIG. 1A.

The protective material may be made of or include silicon nitride, silicon oxynitride, carbon-containing silicon nitride, carbon-containing silicon oxynitride, one or more other suitable materials, or a combination thereof. The protective material may be deposited using a CVD process, an ALD process, one or more other applicable processes, or a combination thereof. The planarization process used may include a CMP process, a grinding process, a dry polishing process, an etching process, one or more other applicable processes, or a combination thereof.

As shown in FIG. 1A, some remaining portions of the dielectric layer 106 form multiple dielectric fins such as dielectric fins 116A1, 116A2, and 116B. Some other remaining portions of the dielectric layer 106, remaining portions of the dielectric layer 108, and the protective elements 110 together form multiple dielectric fins such as dielectric fins 116C and 116D, as shown in FIG. 1A. In some embodiments, the dielectric fin 116C or 116D is wider than each of the dielectric fins 116A1, 116A2, and 116B. In some embodiments, the dielectric fins 116A1, 116A2, 116B, 116C, and 116D are substantially as tall as each other.

Figure 1B:
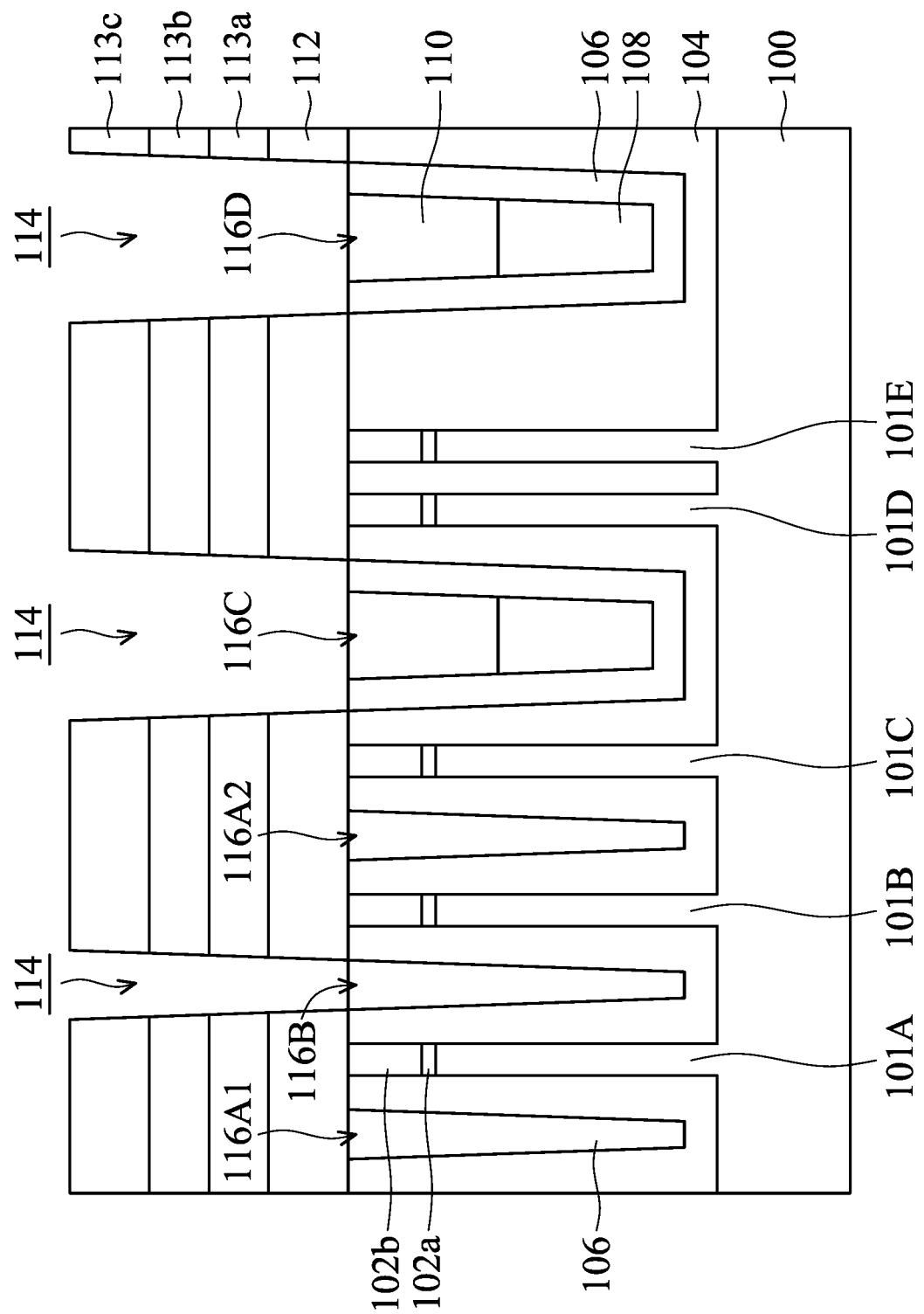

As shown in FIG. 1B, a hard mask element 112 is formed over the structure shown in FIG. 1A, in accordance with some embodiments. Multiple layers such as layers 113a-113c may be formed over the hard mask element 112 to assist in the patterning of the hard mask element 112. The layers 113a-113c may include one or more oxide layers and one or more photoresist layers. By using one or more photolithography processes and one or more etching processes, the hard mask element 112 is patterned with a desired pattern. As a result, multiple trenches 114 are formed exposing the top surfaces of the dielectric fins 116B, 116C, and 116D, as shown in FIG. 1B.

Figure 1C:
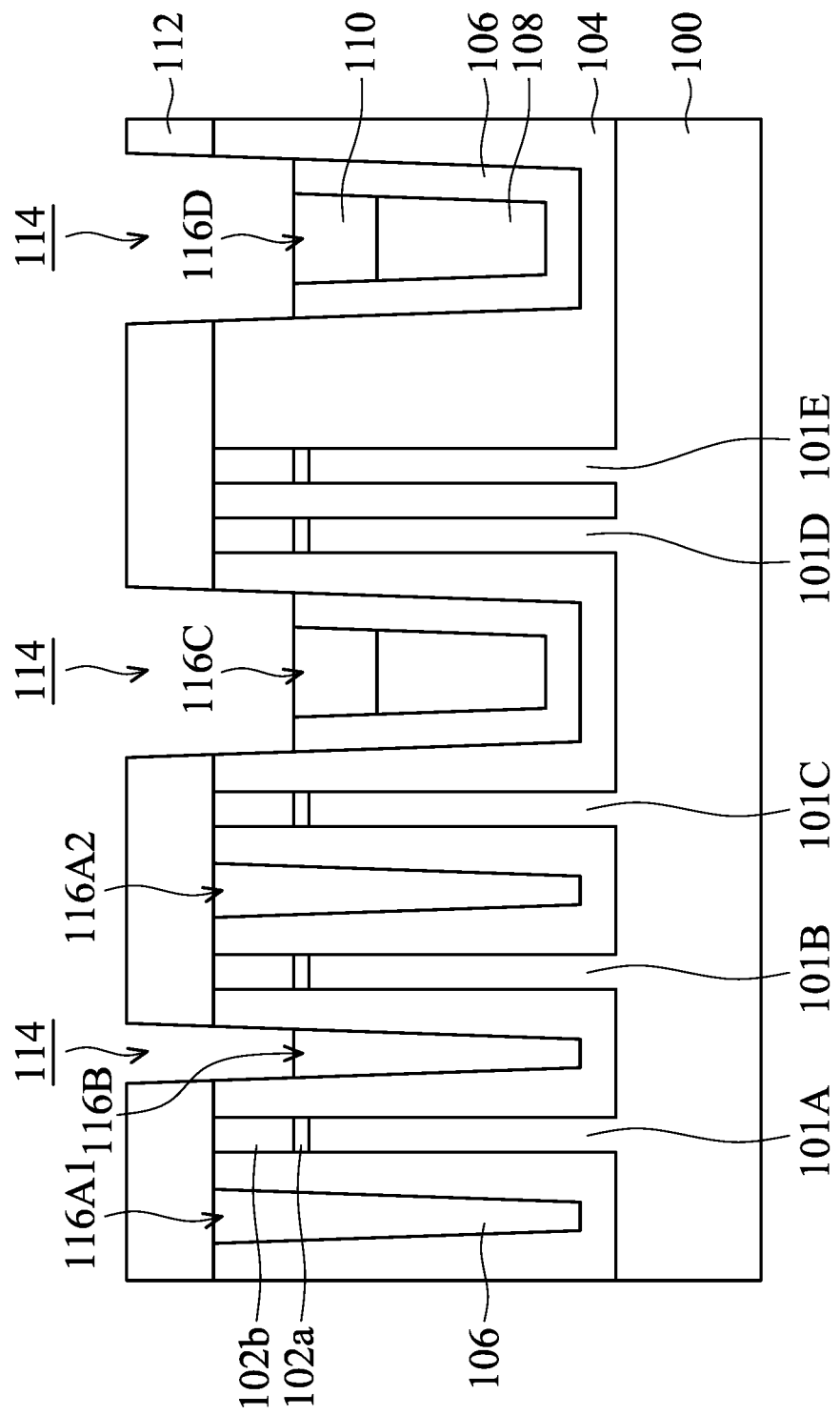

Afterwards, the layers 113a-113c are removed. As shown in FIG. 1C, the upper portions of the dielectric fins 116B, 116C, and 116D are removed, in accordance with some embodiments. With the hard mask element 112 as an etching mask, one or more etching processes (such as a dry etching process) are used to recess the dielectric fins 116B, 116C, and 116D. As a result, each of the dielectric fins 116B, 116C, and 116D is shorter than each of the dielectric fins 116A1 and 116A2, as shown in FIG. 1C. The topmost surfaces of the dielectric fins 116B, 116C, and 116D are at a lower height level than the topmost surfaces of the dielectric fins 116A1 and 116A2.

Figure 1D:
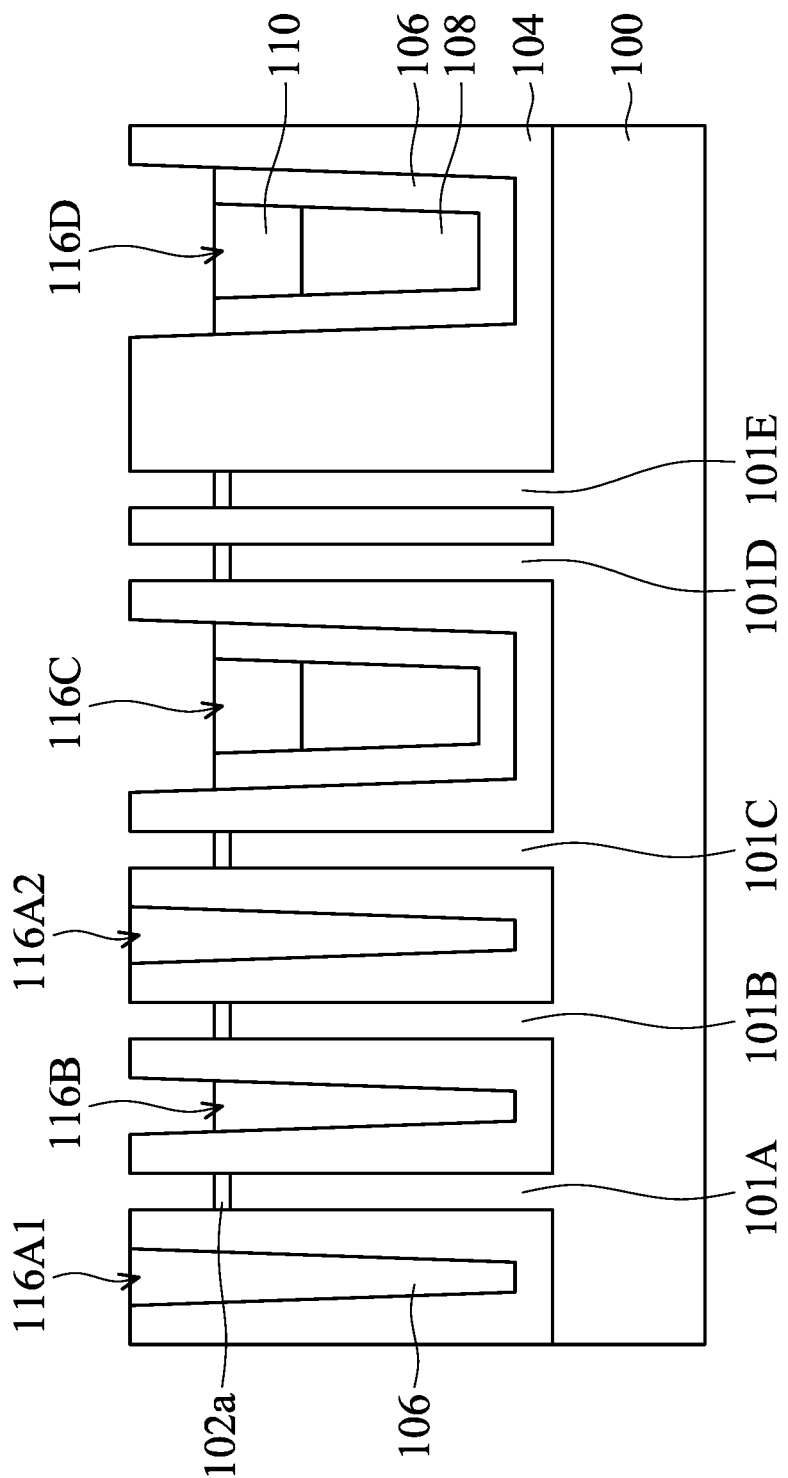

As shown in FIG. 1D, the hard mask element 112, the first mask layer 102a, and the second mask layer 102b are removed, in accordance with some embodiments. One or more etching processes may be used to remove the hard mask element 112, the first mask layer 102a, and the second mask layer 102b.

Figure 1E:
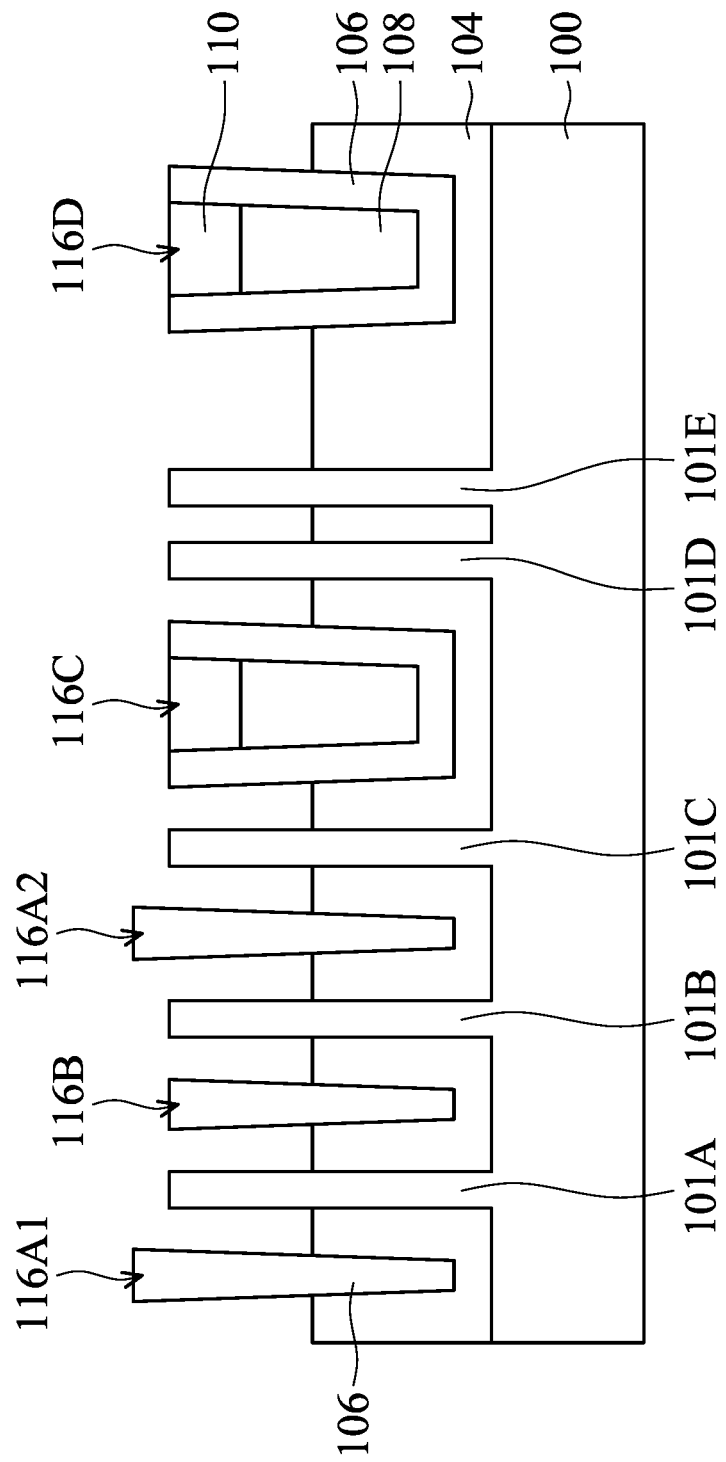

As shown in FIG. 1E, the insulating layer 104 is recessed, in accordance with some embodiments. The remaining insulating layer 104 may function as an isolation structure (such as an STI structure) to prevent undesired current leakage between the semiconductor protruding structures 101A-101E. One or more etching processes may be used to partially remove the insulating layer 104. After the recessing of the insulating layer 104, the semiconductor protruding structures 101A-101E and the dielectric fins 116A1, 116A2, 116B, 116C, and 116D protrude from the topmost surface of the remaining portion of the insulating layer 104, as shown in FIG. 1E.

Figure 1F:
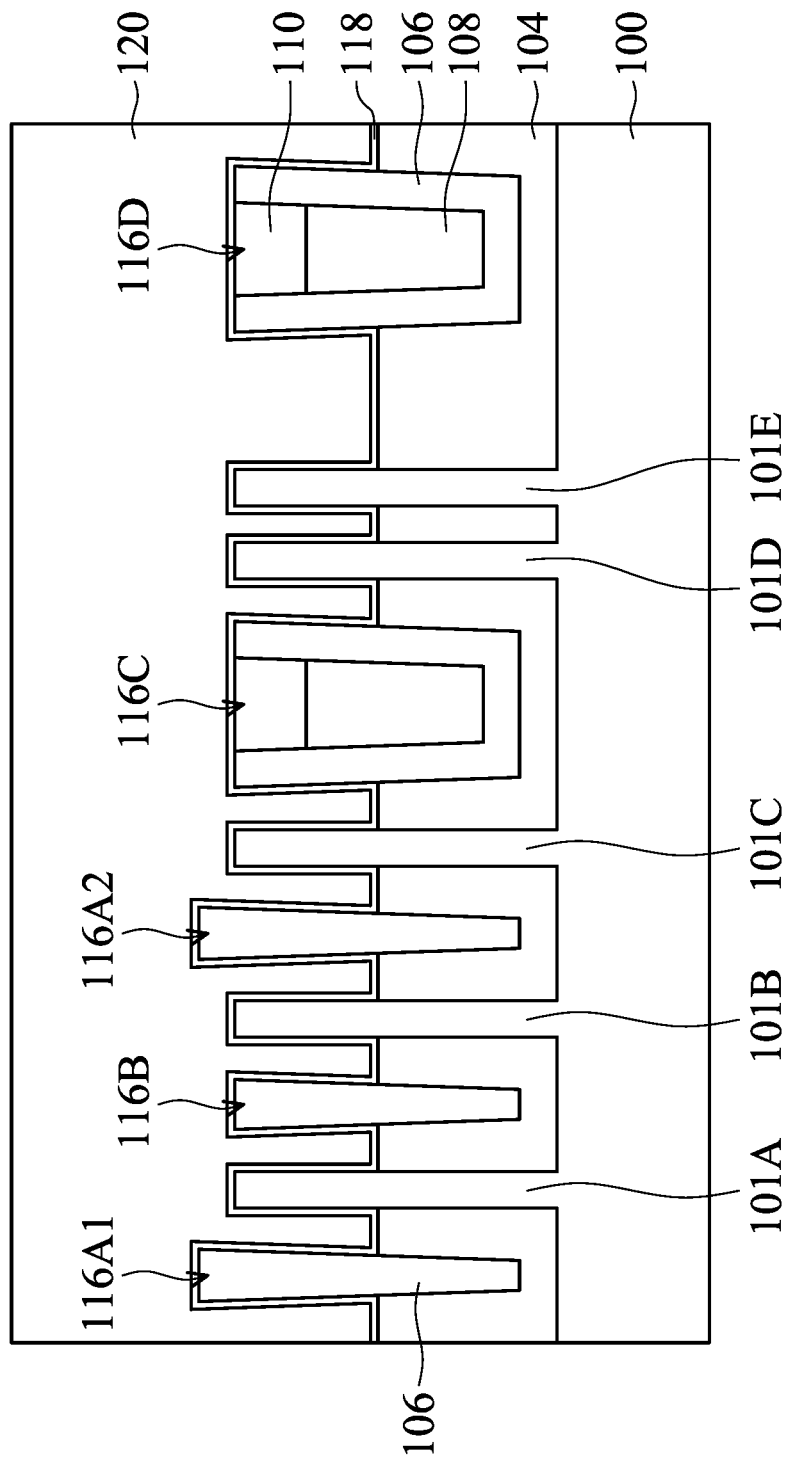

As shown in FIG. 1F, a dummy gate stack is formed to surround the semiconductor protruding structures 101A-101E and the dielectric fins 116A1, 116A2, 116B, 116C, and 116D, in accordance with some embodiments. The dummy gate stack extends across opposite sidewalls of each of the semiconductor protruding structures 101A-101E and the dielectric fins 116A1, 116A2, 116B, 116C, and 116D, as shown in FIG. 1F. The dummy gate stack includes a dummy gate dielectric layer 118 and a dummy gate electrode 120.

The dummy gate stack is formed to partially cover and to extend across the semiconductor protruding structures 101A-101E and the dielectric fins 116A1, 116A2, 116B, 116C, and 116D, in accordance with some embodiments. In some embodiments, the dummy gate stack wraps around the semiconductor protruding structures 101A-101E and the dielectric fins 116A1, 116A2, 116B, 116C, and 116D, as shown in FIG. 1F.

The dummy gate dielectric layer 118 may be made of or include silicon oxide. The dummy gate electrode 120 may be made of or include polysilicon. In some embodiments, a dummy gate dielectric material layer and a dummy gate electrode layer are sequentially deposited over the structure shown in FIG. 1E. Afterwards, the dummy gate dielectric material layer and the dummy gate electrode layer are patterned to form the dummy gate stack that partially covers the semiconductor protruding structures 101A-101E and the dielectric fins 116A1, 116A2, 116B, 116C, and 116D.

Afterwards, the portions of the semiconductor protruding structures 101A-101E that are not covered by the dummy gate stack are partially removed, in accordance with some embodiments. One of more etching processes may be used to recess the semiconductor protruding structures 101A-101E. Afterwards, epitaxial structures are formed over the semiconductor protruding structures 101A-101E, in accordance with some embodiments. In some embodiments, the epitaxial structures function as source/drain structures. Source/drain structures or source/drain region(s) may refer to a source or a drain, individually or collectively dependent upon the context. The formation of the epitaxial structures may be similar to the embodiments that will be illustrated later with reference made to FIGS. 5A-5F.

Afterwards, a dielectric layer is formed to cover the epitaxial structures and the portions of the dielectric fins that are not covered by the dummy gate stack, in accordance with some embodiments. The dielectric layer further laterally surrounds the dummy gate stack. The dielectric layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, a dielectric material layer is deposited using an FCVD process, a CVD process, an ALD process, one or more other applicable processes, or a combination thereof. Afterwards, a planarization process is used to partially remove the dielectric material layer. As a result, the remaining portions of the dielectric material layer form the dielectric layer that surrounds the dummy gate stack and the epitaxial structures. The planarization process may include a CMP process, a grinding process, an etching process, a dry polishing process, one or more other applicable processes, or a combination thereof. In some embodiments, after the planarization process, the top surfaces of the dielectric layer and the dummy gate electrodes 120 are substantially level.

Figure 1G:
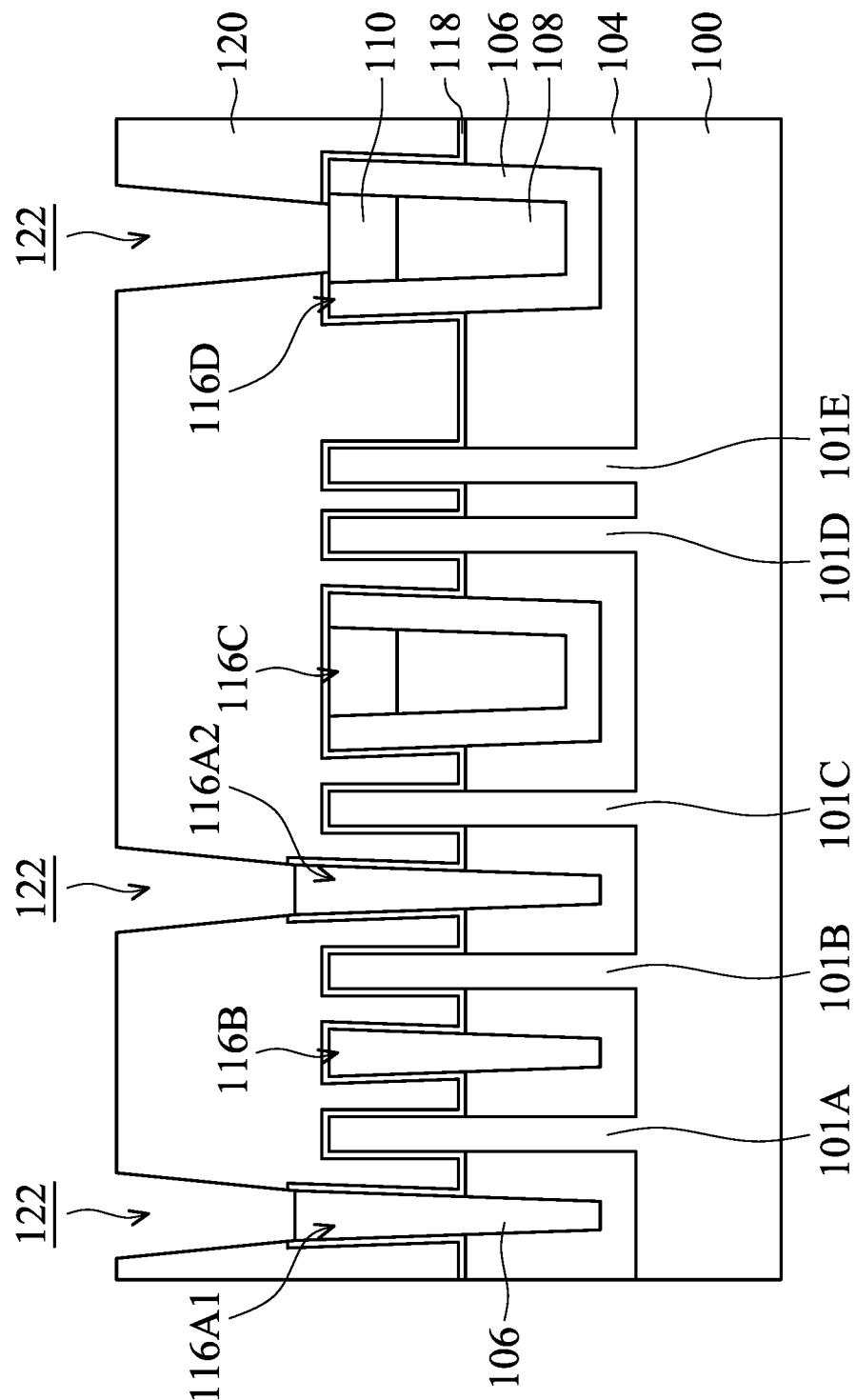

As shown in FIG. 1G, the dummy gate electrode 120 and the dummy gate dielectric layer 118 are then partially removed, in accordance with some embodiments. As a result, multiple opening 122 are formed in the dummy gate stack. The openings 122 expose the dielectric fins 116A1, 116A2, and 116D, as shown in FIG. 1G. The openings 122 are used to contain isolation structures that will be formed later. The isolation structures may be used to separate the gate stack into separate regions. One or more photolithography processes and one or more etching processes may be used to form the openings.

Since the openings 122 expose the taller dielectric fins such as the dielectric fins 116A1 and 116A2 or the wider dielectric fin such as the dielectric fin 116D, the aspect ratio of the openings 122 may thus be within an acceptable range. The formation of the openings 122 and the subsequent formation of the isolation structures may be easier.

Figure 1H:
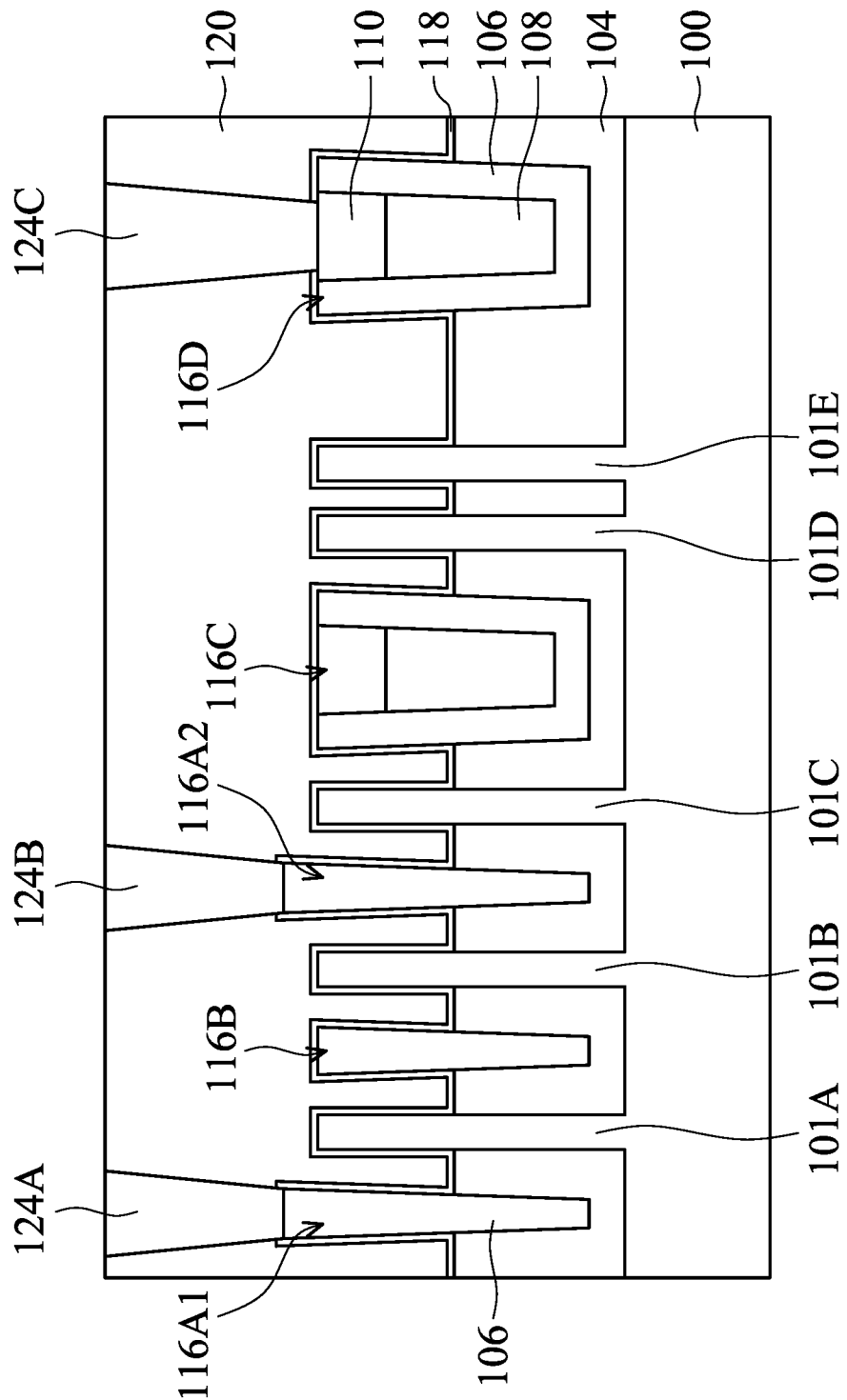

As shown in FIG. 1H, isolation structures 124A, 124B, and 124C are formed in the openings 122, in accordance with some embodiments. The isolation structures 124A, 124B, and 124C and the dielectric fins 116A1, 116A2, and 116D together cut the dummy gate stack into multiple portions that are electrically isolated from each other.

In some embodiments, an isolation material layer is deposited over the dummy gate electrode 120 to overfill the openings 122. The isolation material layer may be made of or include silicon nitride, silicon oxynitride, carbon-containing silicon nitride, carbon-containing silicon oxynitride, one or more other suitable materials, or a combination thereof. The isolation material layer may be deposited using a CVD process, an ALD process, an FCVD process, one or more other applicable processes, or a combination thereof.

Afterwards, a planarization process is used to remove the excess portion of the isolation material layer outside of the openings 122. As a result, the remaining portions of the isolation material layer form the isolation structures 124A, 124B, and 124C. The planarization process may include a CMP process, a grinding process, a dry polishing process, an etching process, one or more other applicable processes, or a combination thereof.

Figure 1I:
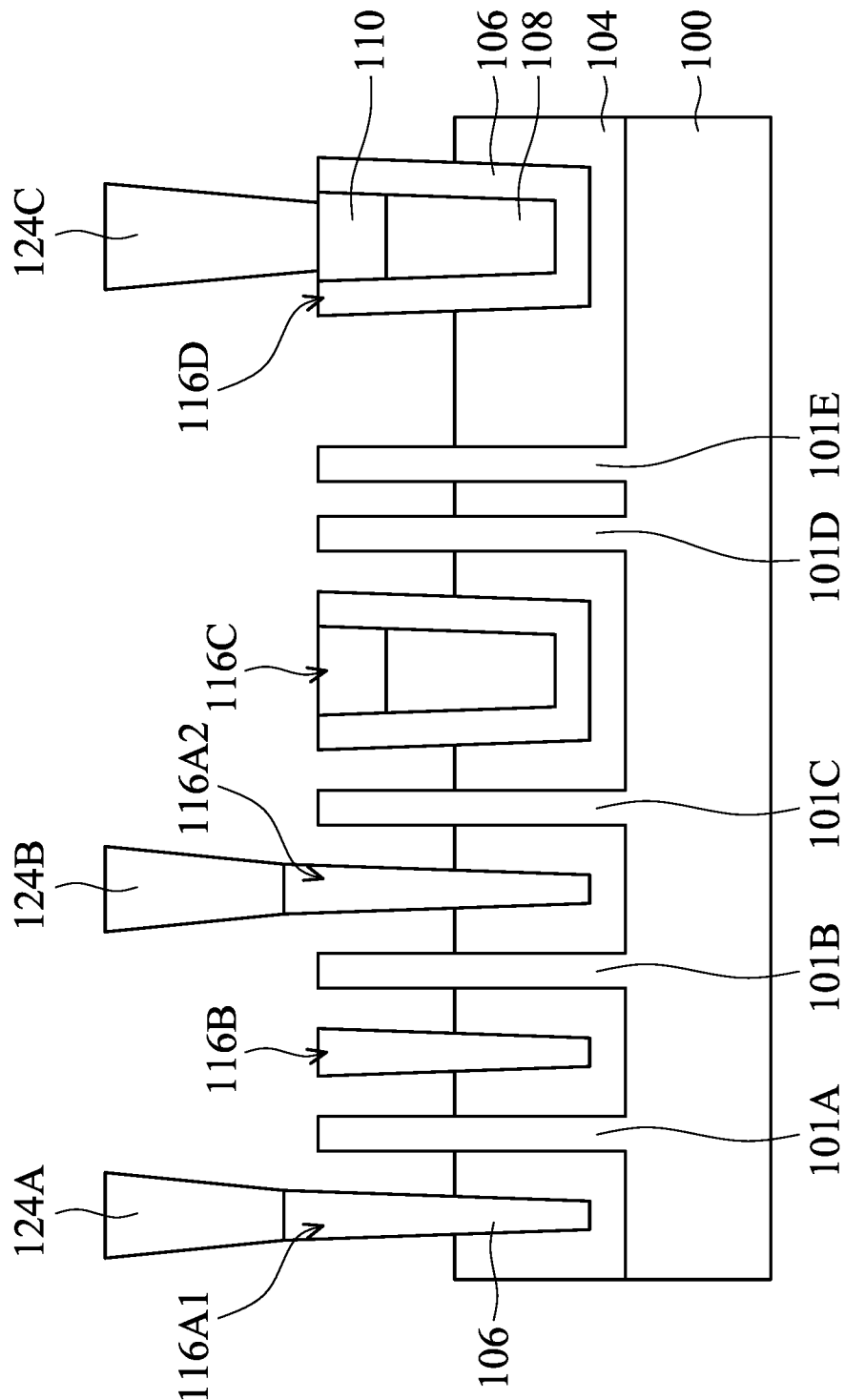

As shown in FIG. 1I, the dummy gate dielectric layer 118 and the dummy gate electrode 120 are removed, in accordance with some embodiments. One or more etching processes may be used to remove the dummy gate stack, so as to form a trench surrounded by the dielectric layer. As a result, the semiconductor protruding structures 101A-101E, the dielectric structures 116A1, 116A2, 116B, 116C, and 116D, and the isolation structures 124A-124C are exposed by the trench.

In some embodiments, the isolation structures 124A-124C are formed on the taller dielectric fins such as the dielectric fins 116A1 and 116A2 or the wider dielectric fin such as the dielectric fin 116D. Therefore, even if there is a minor overlay shift between the isolation structures 124A-124C and the underlying dielectric fins, the space between the dielectric fins and the semiconductor protruding structures may substantially not occupied by the isolation structures 124A-124C. As a result, the removal of the dummy gate dielectric layer 118 and the dummy gate electrode 120 are prevented from being negatively affected by the isolation structures 124A-124C. The dummy gate may thus be completely removed without leaving undesired residues, which facilitates the subsequent formation of the metal gate stack. The performance and reliability of the semiconductor device structure are greatly improved.

Figure 1J:
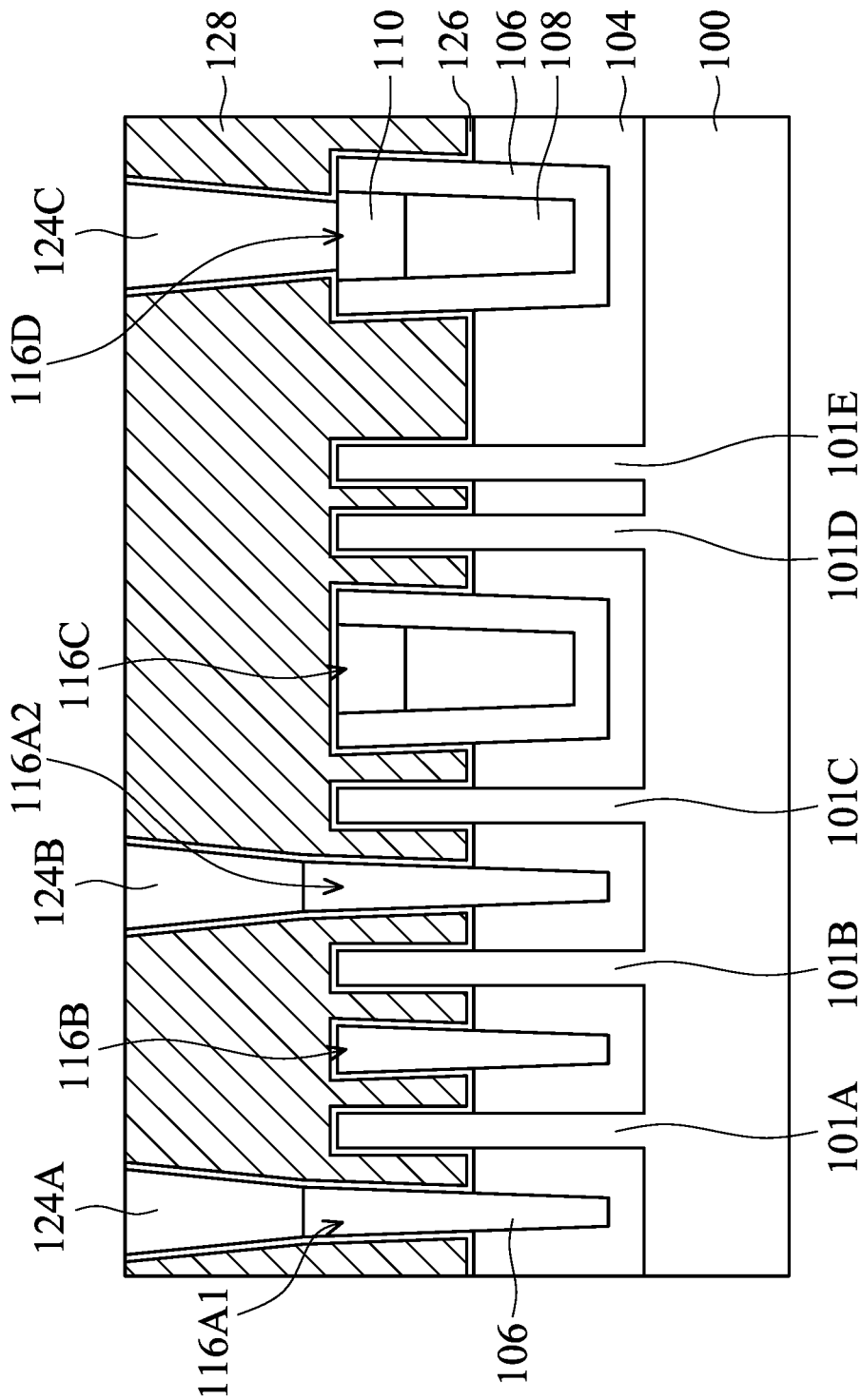

As shown in FIG. 1J, a metal gate stack is then formed in the trench to surround the semiconductor protruding structures 101A-101E, the dielectric structures 116A1, 116A2, 116B, 116C, and 116D, and the isolation structures 124A-124C, in accordance with some embodiments. The metal gate stack is wrapped around the semiconductor protruding structures 101A-101E, the dielectric structures 116A1, 116A2, 116B, 116C, and 116D, and the isolation structures 124A-124C, as shown in FIG. 1J.

The metal gate stack may include multiple metal gate stack layers. The metal gate stack may include a gate dielectric layer 126 and a metal gate electrode 128. The metal gate electrode 128 may include one or more work function layers and a conductive filling layer. In some embodiments, the formation of the metal gate stack involves the deposition of multiple metal gate stack layers over the dielectric layer to fill the trench formed after the removal of the dummy gate stack.

In some embodiments, the gate dielectric layer 126 is made of or includes a dielectric material with high dielectric constant (high-K). The gate dielectric layer 126 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 126 may be deposited using an ALD process, a CVD process, one or more other applicable processes, or a combination thereof.

In some embodiments, before the formation of the gate dielectric layer 126, an interfacial layer is formed on the surfaces of the semiconductor protruding structures 101A-101E. The interfacial layers are very thin and are made of, for example, silicon oxide or germanium oxide. In some embodiments, the interfacial layers are formed by applying an oxidizing agent on the surfaces of the semiconductor protruding structures 101A-101E. For example, a hydrogen peroxide-containing liquid may be applied or provided on the surfaces of the semiconductor protruding structures 101A-101E, so as to form the interfacial layers.

The work function layer of the metal gate electrode 128 may be used to provide or to adjust the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 126 using an ALD process, a CVD process, a PVD process, an electroplating process, an electroless plating process, one or more other applicable processes, or a combination thereof. In some embodiments, the formation of the work function layer involves one or more patterning processes. As a result, the p-type work function layer and the n-type work function layer are selectively formed over respective regions.

In some embodiments, a barrier layer is formed before the work function layer to interface the gate dielectric layer 126 with the subsequently formed work function layer. The barrier layer may also be used to prevent diffusion between the gate dielectric layer 126 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

The conductive filling of the metal gate electrode 128 is used to fill the remaining space in the trench. In some embodiments, the conductive filling is made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trench, in accordance with some embodiments. As a result, the remaining portions of the metal gate stack layers form the metal gate stack, as shown in FIG. 1J.

Figure 2:
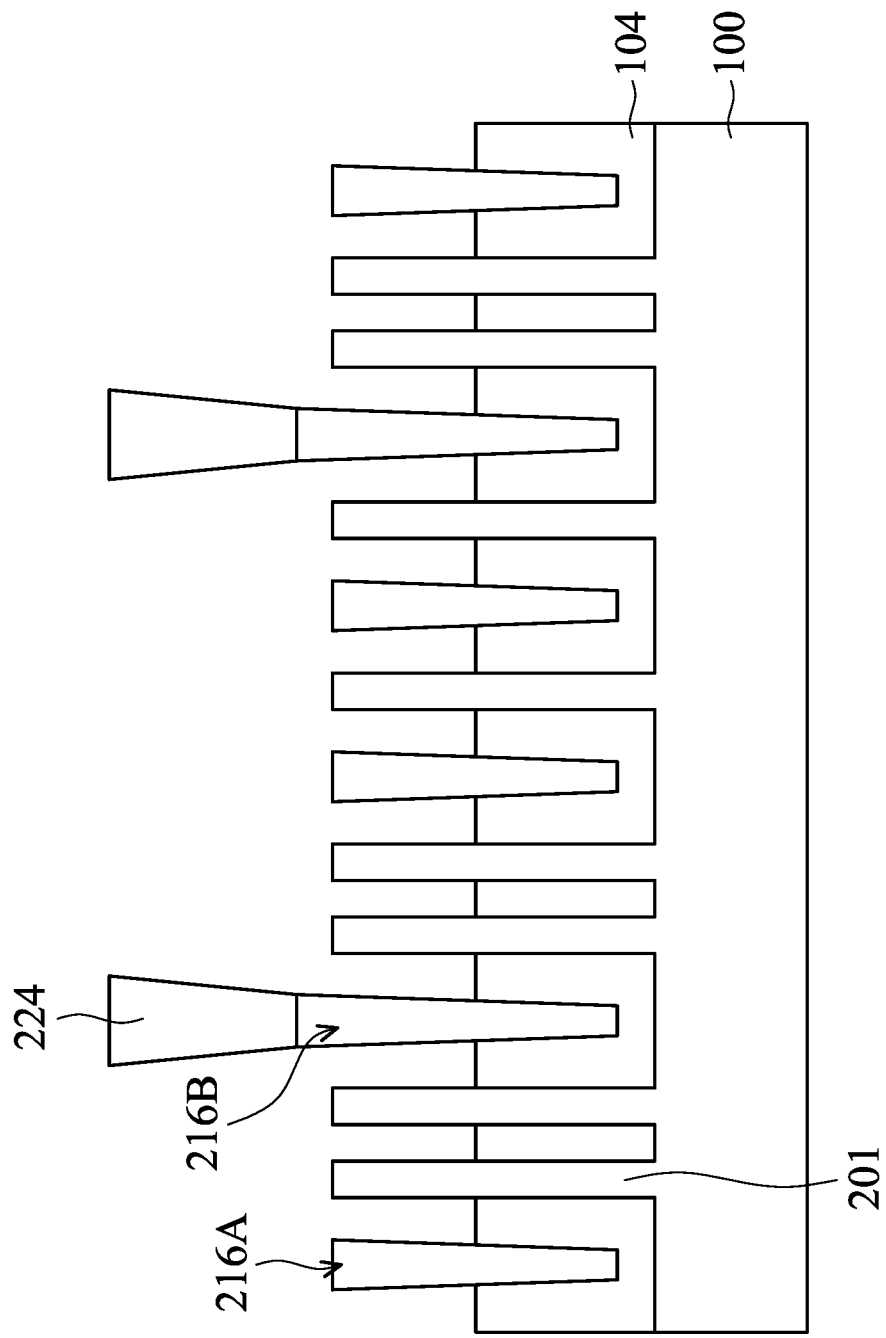
FIG. 2 is a cross-sectional view of an intermediate stage of a process for forming a portion of a semiconductor device structure, in accordance with some embodiments.

Many variations and/or modifications can be made to embodiments of the disclosure. FIG. 2 is a cross-sectional view of an intermediate stage of a process for forming a portion of a semiconductor device structure, in accordance with some embodiments. As shown in FIG. 2, a structure that is similar to the structure shown in FIG. 1I is formed. The structure shown in FIG. 2 may a portion of a memory device region, such as a static random access memory (SRAM) device region. Multiple semiconductor fins 201 and multiple dielectric fins are formed over the semiconductor substrate 100.

Similar to the embodiments illustrated in FIGS. 1A-1J, some dielectric fins such as the dielectric fins 216B are formed to be taller than some other dielectric fins such as the dielectric fins 216A. The taller dielectric fins 216B facilitate the subsequent formation of the isolation structures 224 and the subsequent formation of a metal gate stack. The performance and reliability of the semiconductor device structure are improved.

Figure 3:
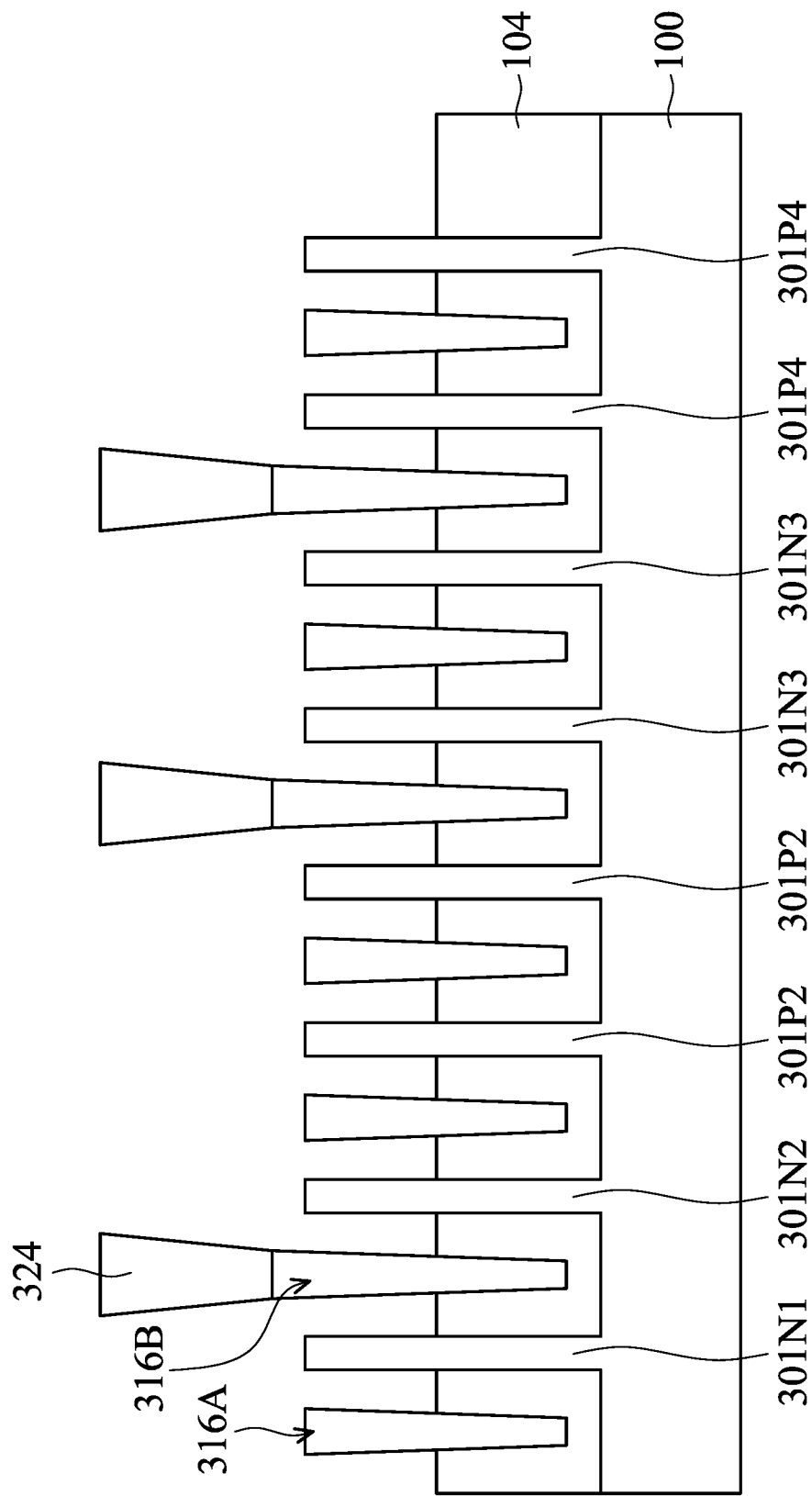
FIG. 3 is a cross-sectional view of an intermediate stage of a process for forming a portion of a semiconductor device structure, in accordance with some embodiments.

Many variations and/or modifications can be made to embodiments of the disclosure. FIG. 3 is a cross-sectional view of an intermediate stage of a process for forming a portion of a semiconductor device structure, in accordance with some embodiments. In some embodiments, multiple semiconductor protruding structures (or semiconductor fins) 301N1-301N3 and 301P2-301P4 are formed over the semiconductor substrate 100. The semiconductor protruding structures 301N1-301N3 may function as channel structures of NMOS devices, and the semiconductor protruding structures 301P2-301P4 may function as channel structures of PMOS devices.

Similar to the embodiments illustrated in FIGS. 1A-1J, some dielectric fins such as the dielectric fins 316B are formed to be taller than some other dielectric fins such as the dielectric fins 316A. The taller dielectric fins 316B facilitate the subsequent formation of the isolation structures 324 and the subsequent formation of a metal gate stack. The performance and reliability of the semiconductor device structure are improved.

Figure 4:
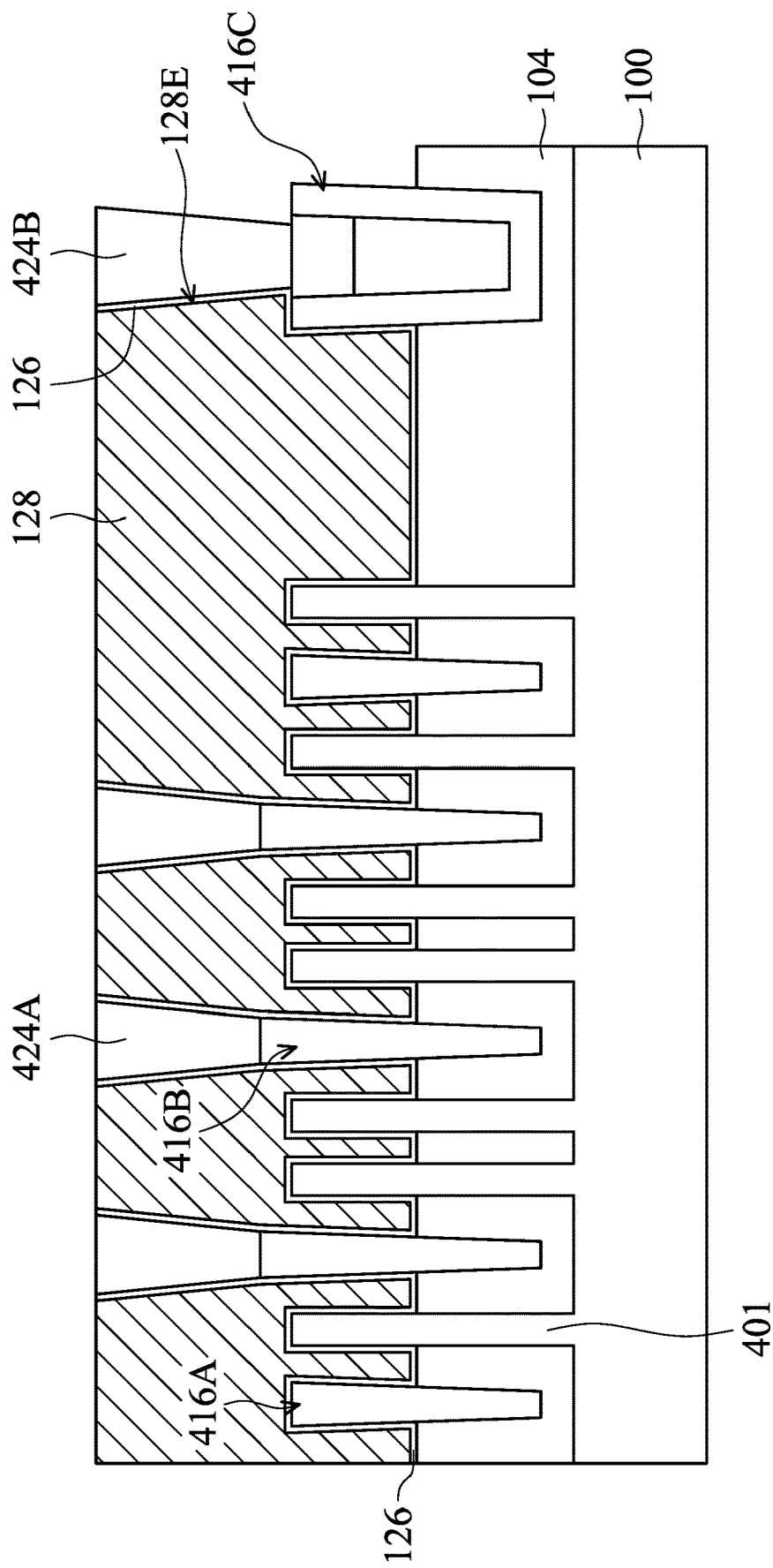
FIG. 4 is a cross-sectional view of an intermediate stage of a process for forming a portion of a semiconductor device structure, in accordance with some embodiments.

Many variations and/or modifications can be made to embodiments of the disclosure. FIG. 4 is a cross-sectional view of an intermediate stage of a process for forming a portion of a semiconductor device structure, in accordance with some embodiments. In some embodiments, multiple semiconductor fins 401 and multiple dielectric fins 416A and 416B are formed over the semiconductor substrate 400.

Similar to the embodiments illustrated in FIG. 1J, the gate dielectric layer 126 and the metal gate electrode 128 are formed to surround the semiconductor fins 401 and the dielectric fins 416A and 416B. The metal gate electrode 128 extends across opposite sidewalls of the dielectric fins.

Similar to the embodiments illustrated in FIGS. 1A-1J, some dielectric fins such as the dielectric fins 416B are formed to be taller than some other dielectric fins such as the dielectric fins 416A. The taller dielectric fins 416B facilitate the subsequent formation of the isolation structures 424A and the subsequent formation of the metal gate stack. The performance and reliability of the semiconductor device structure are improved.

In some embodiments, a dielectric fin 416C is formed over the semiconductor substrate 100, as shown in FIG. 4. In some embodiments, the dielectric fin 416C is positioned at a line end of the metal gate stack. The metal gate stack does not extend across opposite sidewalls of the dielectric fin 416C. In some embodiments, the metal gate stack is in direct contact with only one of the sidewalls of the dielectric fin 416C.

In some embodiments, an isolation structure 424B is formed over the dielectric fin 416C. In some embodiments, the dielectric fin 416C is wider than the dielectric fin 416A or the dielectric fin 416B. In some embodiments, the dielectric fin 416C is shorter than the dielectric fin 416A or the dielectric fin 416B. In some embodiments, the isolation structure 424B is taller and/or wider than each of the isolation structures 424A.

Figure 5A:
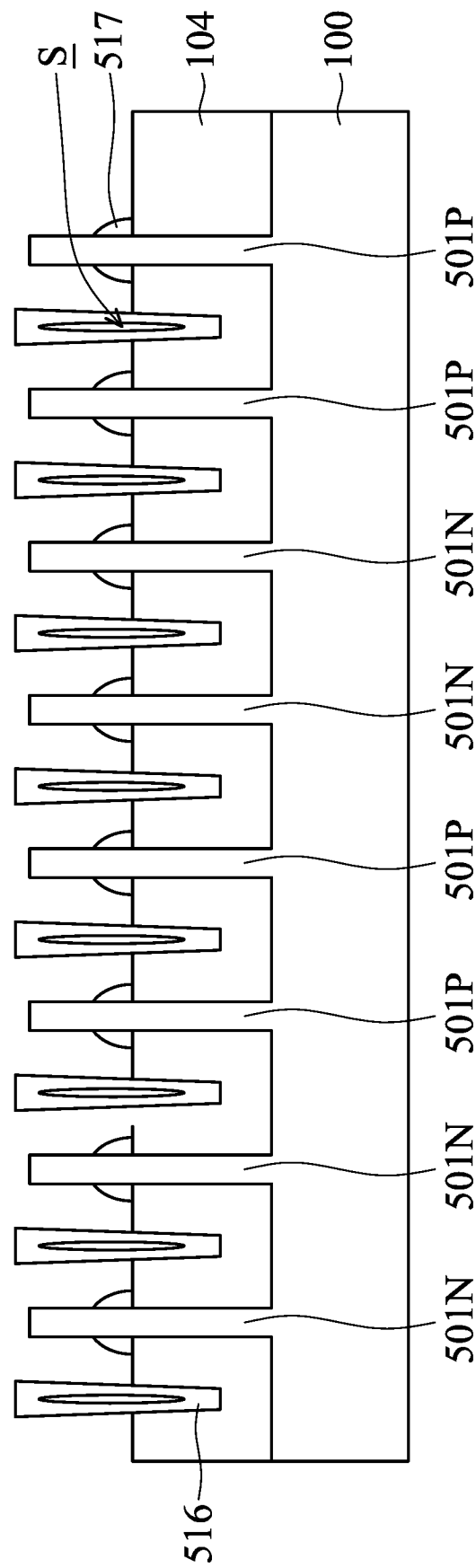
FIGS. 5A-5F are cross-sectional views of various stages of a process for forming a portion of a semiconductor device structure, in accordance with some embodiments.

Many variations and/or modifications can be made to embodiments of the disclosure. FIGS. 5A-5F are cross-sectional views of various stages of a process for forming a portion of a semiconductor device structure, in accordance with some embodiments. As shown in FIG. 5A, a structure similar to the structure shown in FIG. 3 is formed. Unlike the embodiments shown in FIG. 3, FIG. 5 shows the region beside a gate stack but not under a gate stack. FIG. 5A shows the region where epitaxial structures will be formed to function as source/drain structures. Source/drain structures or source/drain region(s) may refer to a source or a drain, individually or collectively dependent upon the context.

In some embodiments, multiple semiconductor protruding structures 501N and 501P are formed over the semiconductor substrate 100, as shown in FIG. 5A. N-type doped epitaxial structures will be formed on the semiconductor protruding structures 501N, and p-type doped epitaxial structures will be formed on the semiconductor protruding structures 501P. Multiple dielectric fins 516 are formed over the semiconductor substrate 100. In some embodiments, similar to the embodiments illustrated in FIGS. 1-4, some of the dielectric fins 516 are formed to be taller than other dielectric fins. Similar to the embodiments illustrated in FIGS. 1-4, there may be isolation structures formed on the portions of the taller dielectric fins that are surrounded by a gate stack.

In some embodiments, the formation of the dielectric fins 516 may involve one or more ALD processes. Due to the characteristic of the ALD processes, there may be seams S formed in the dielectric fins 516, as shown in FIG. 5A.

In some embodiments, multiple supporting elements 517 are formed over lower portions of the semiconductor protruding structures 501N and 501P. The supporting elements 517 may be used to assist in the subsequent formation of epitaxial structures.

Figure 5B:
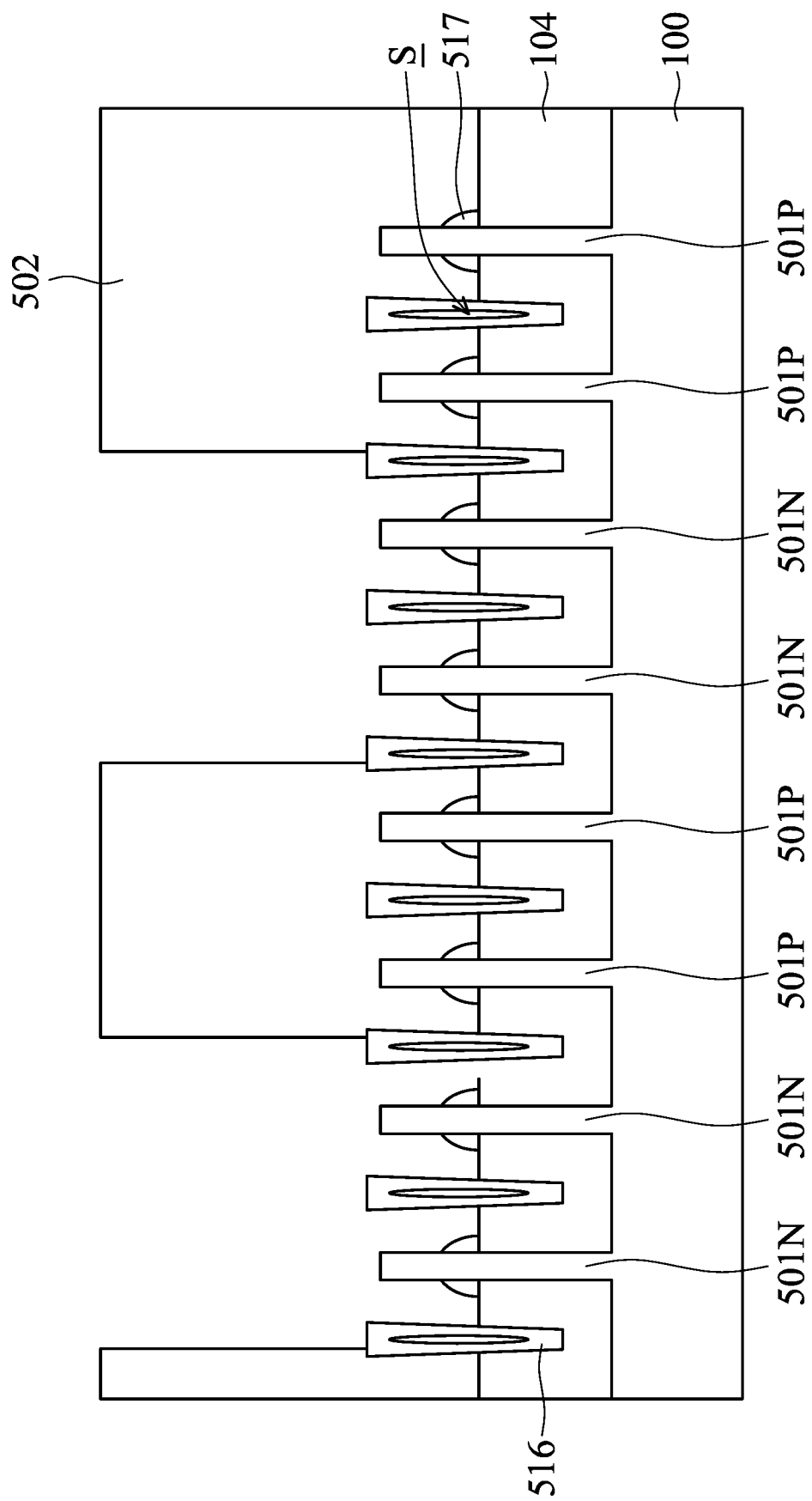

As shown in FIG. 5B, a mask element 502 is formed over the structure shown in FIG. 5A, in accordance with some embodiments. The mask element 502 has openings that expose the semiconductor protruding structures 501N. The semiconductor protruding structures 501P are covered by the mask element 502.

In some embodiments, some of the dielectric fins 516 are partially covered by the mask element 502 while some other dielectric fins 516 are completely exposed by the openings of the mask element 502, as shown in FIG. 5B. As shown in FIG. 5B, each of the dielectric fins 516 that is between a semiconductor protruding structure 501N and a semiconductor protruding structure 501P is partially covered by the mask element 502.

In some embodiments, the side of the dielectric fin 516 near the semiconductor protruding structure 501N is exposed while the side of the dielectric fin 516 near the semiconductor protruding structure 501P is covered by the mask element 502. In some embodiments, each of the dielectric fins 516 between two nearby semiconductor protruding structures 501N is exposed. In some embodiments, each of the dielectric fins 516 between two nearby semiconductor protruding structures 501P is covered by the mask element 502.

Figure 5C:
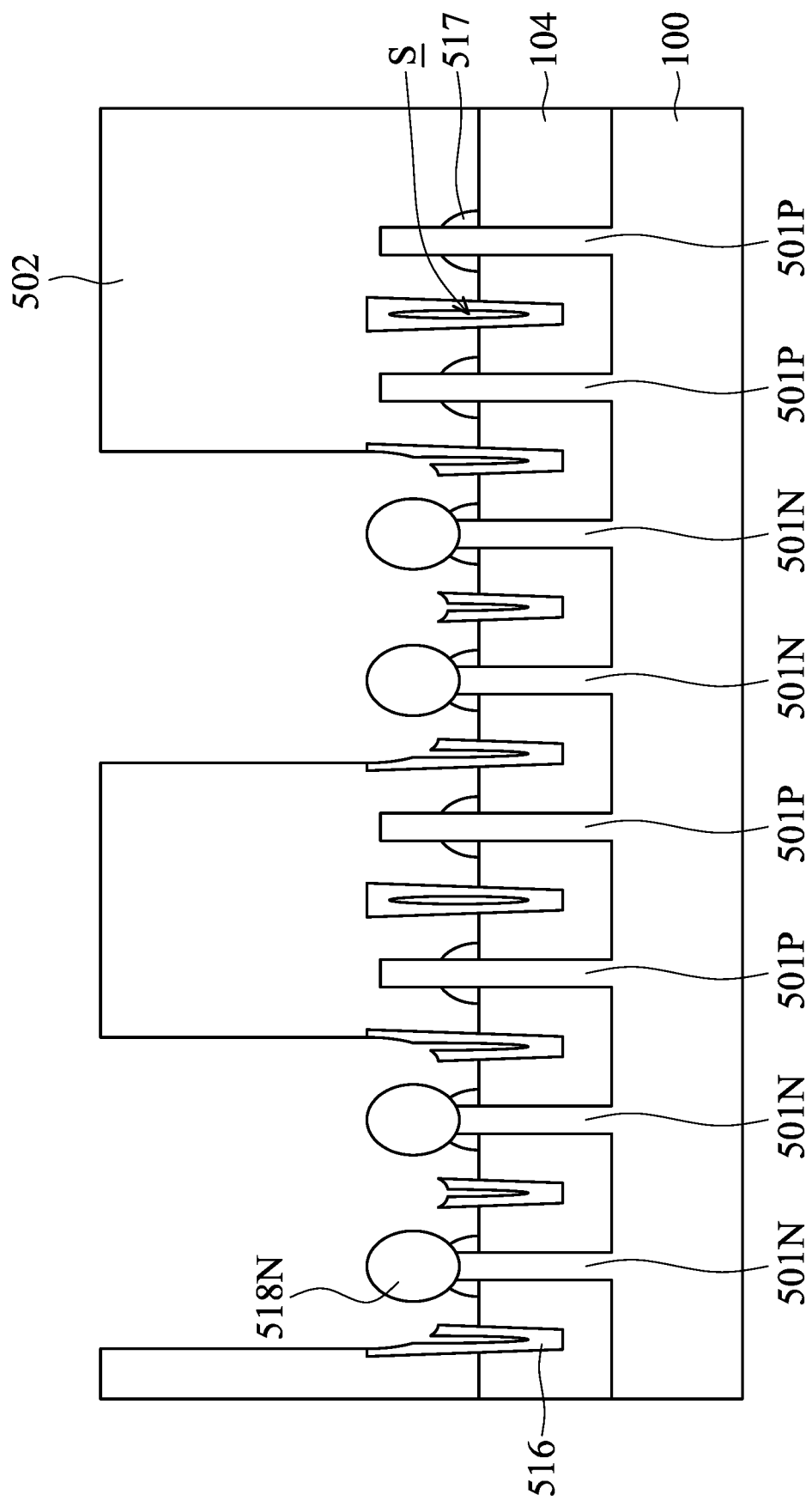

As shown in FIG. 5C, the exposed portions of the semiconductor protruding structures 501N and the dielectric fins 516 are partially removed, in accordance with some embodiments. Afterwards, epitaxial structures 518N are formed on the recessed semiconductor protruding structures 501N, as shown in FIG. 5C.

In some embodiments, the epitaxial structures 518N function as source/drain structures. In some embodiments, the epitaxial structures 518N are n-type doped semiconductor structures. The epitaxial structures 518N may include epitaxially grown silicon, epitaxially grown silicon carbide (SiC), epitaxially grown silicon phosphide (SiP), or another suitable epitaxially grown semiconductor material.

In some embodiments, the epitaxial structures 518N are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 518N are doped with one or more suitable dopants. For example, the epitaxial structures 518N are Si source/drain features doped with phosphor (P), antimony (Sb), or another suitable dopant.

In some embodiments, the epitaxial structures 518N are doped in-situ during their epitaxial growth. In some other embodiments, the epitaxial structures 518N are not doped during the growth of the epitaxial structures 518N. Instead, after the formation of the epitaxial structures 518N, the epitaxial structures 518N are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 518N are further exposed to one or more annealing processes to activate the dopants. For example, a rapid thermal annealing process is used.

In some embodiments, because the dielectric fins 516 near the epitaxial structures 518N are recessed or partially recessed, the epitaxial structures 518N are prevented from being in direct contact with the dielectric fins 516. As a result, the n-type dopants (that may travel around more easily than the p-type dopants) in the epitaxial structures 518N are prevented from reaching the gate stack through the seams S in the dielectric fins 516. The leakage current between the epitaxial structures and the gate stack is thus significantly reduced. The performance and reliability of the semiconductor device structure are improved.

Figure 5D:
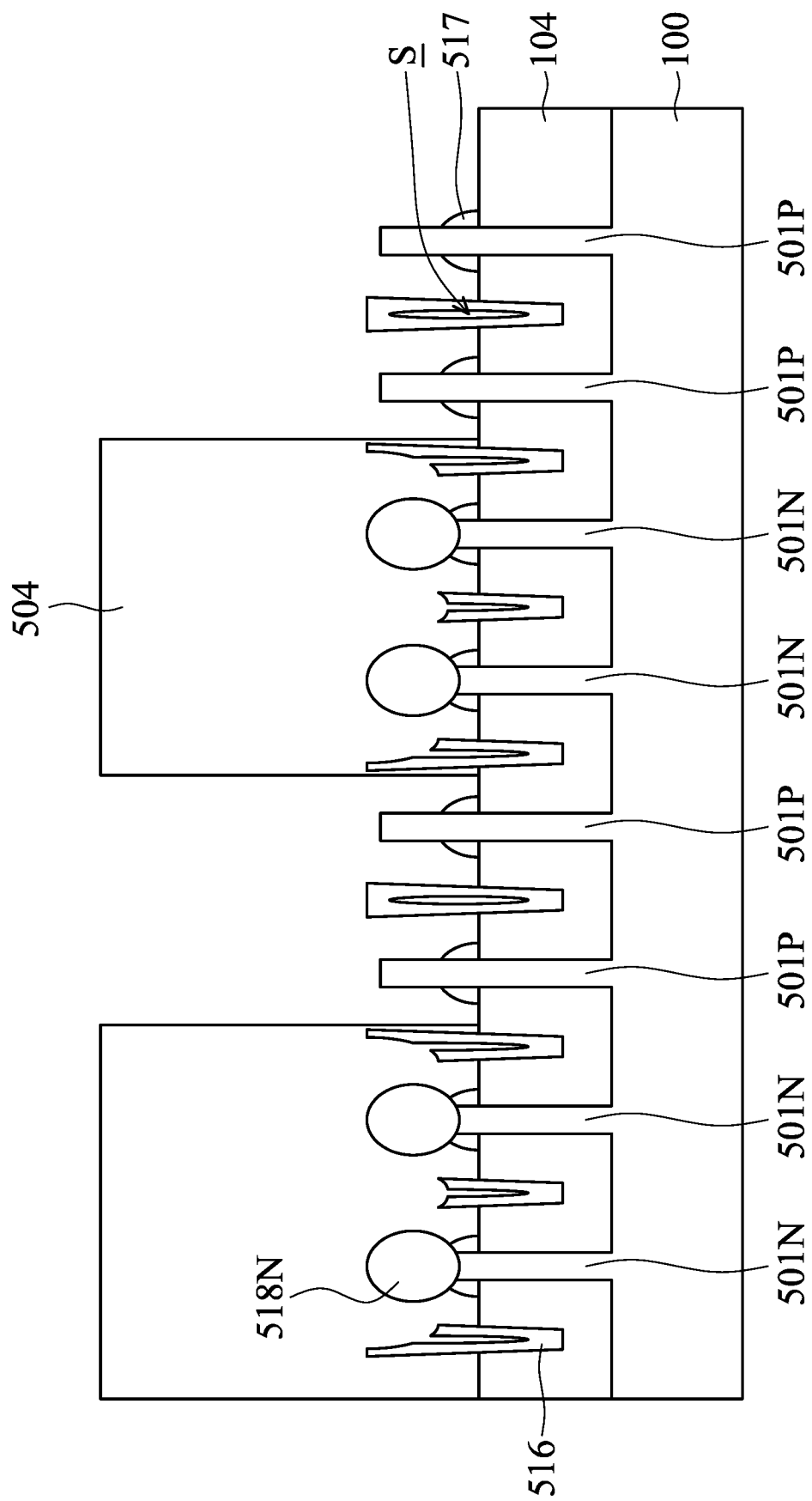

As shown in FIG. 5D, the mask element 502 is removed, and a mask element 504 is formed, in accordance with some embodiments. The mask element 504 covers the epitaxial structures 518N and the dielectric fins 516 that are partially recessed, as shown in FIG. 5D. The mask element 502 has openings that expose the semiconductor protruding structures 501P and the dielectric fins 516 between the semiconductor protruding structures 501P.

Figure 5E:
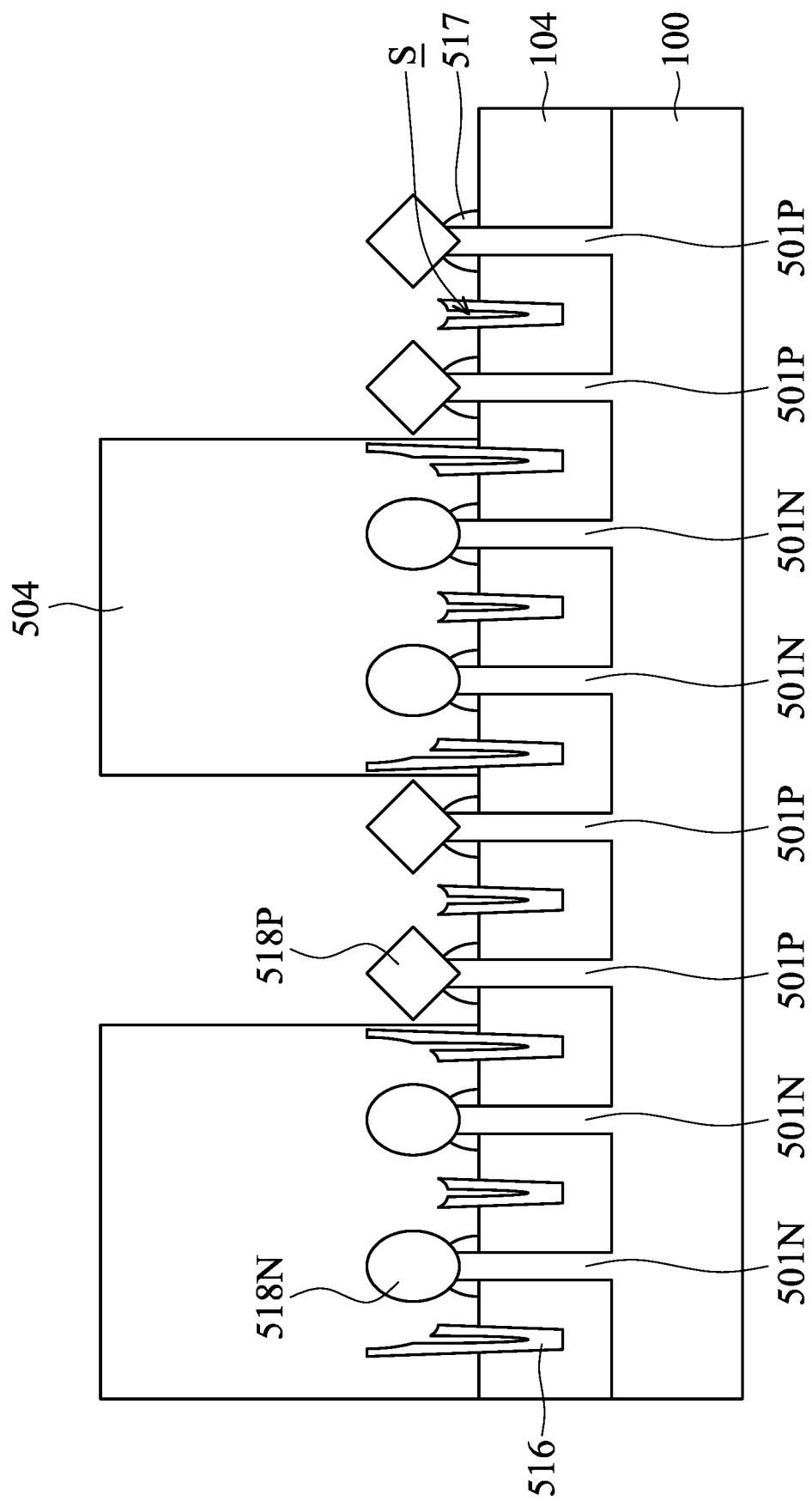

As shown in FIG. 5E, the exposed portions of the semiconductor protruding structures 501P and the dielectric fins 516 are partially removed, in accordance with some embodiments. Afterwards, epitaxial structures 518P are formed on the recessed semiconductor protruding structures 501P, as shown in FIG. 5E.

In some embodiments, the epitaxial structures 518P function as source/drain structures. In some embodiments, the epitaxial structures 518P are p-type doped semiconductor structures. For example, the epitaxial structures 518P may include epitaxially grown silicon germanium or silicon germanium doped with boron.

In some embodiments, the epitaxial structures 518P are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 518P are doped with one or more suitable dopants. For example, the epitaxial structures 518P are SiGe source/drain features doped with boron (B), indium (In), or another suitable dopant.

In some embodiments, the epitaxial structures 518P are doped in-situ during their epitaxial growth. In some other embodiments, the epitaxial structures 518P are not doped during the growth of the epitaxial structures 518P. Instead, after the formation of the epitaxial structures 518P, the epitaxial structures 518P are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 518P are further exposed to one or more annealing processes to activate the dopants. For example, a rapid thermal annealing process is used.

Figure 5F:
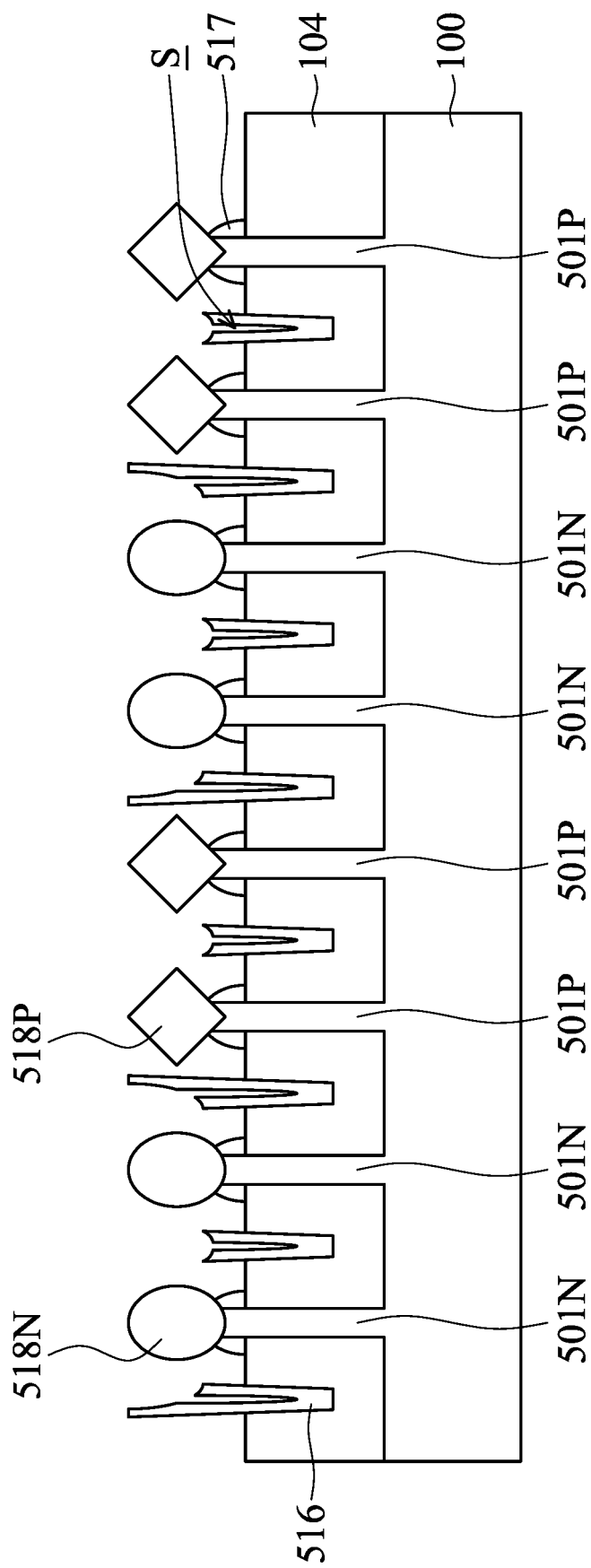

Afterwards, the mask element 504 is removed, as shown in FIG. 5F in accordance with some embodiments. As shown in FIG. 5F, since some of the dielectric fins 516 are only partially recessed, a topmost surface of the partially recessed dielectric fin 516 (such as that between the epitaxial structures 518N and 518P) is higher than a topmost surface of the recessed dielectric fin (such as that between the epitaxial structures 518N and 518N or between the epitaxial structures 518P and 518P).

In some embodiments, each of the partially recessed dielectric fins 516 has a first sidewall facing the epitaxial structure 518N and a second sidewall facing the epitaxial structure 518P, as shown in FIG. 5F. In some embodiments, the first sidewall is a recessed sidewall. The partially recessed dielectric fins 516 may prevent short circuiting between the epitaxial structures 518N and 518P.

After the formation of the epitaxial structures 518N and 518P, a dielectric layer may be formed over the epitaxial structures 518N and 518P to surround the gate stack. Similar to the embodiments illustrated in FIGS. 1G-1J, the isolation structures and the metal gate stack may then be formed.

Figure 6:
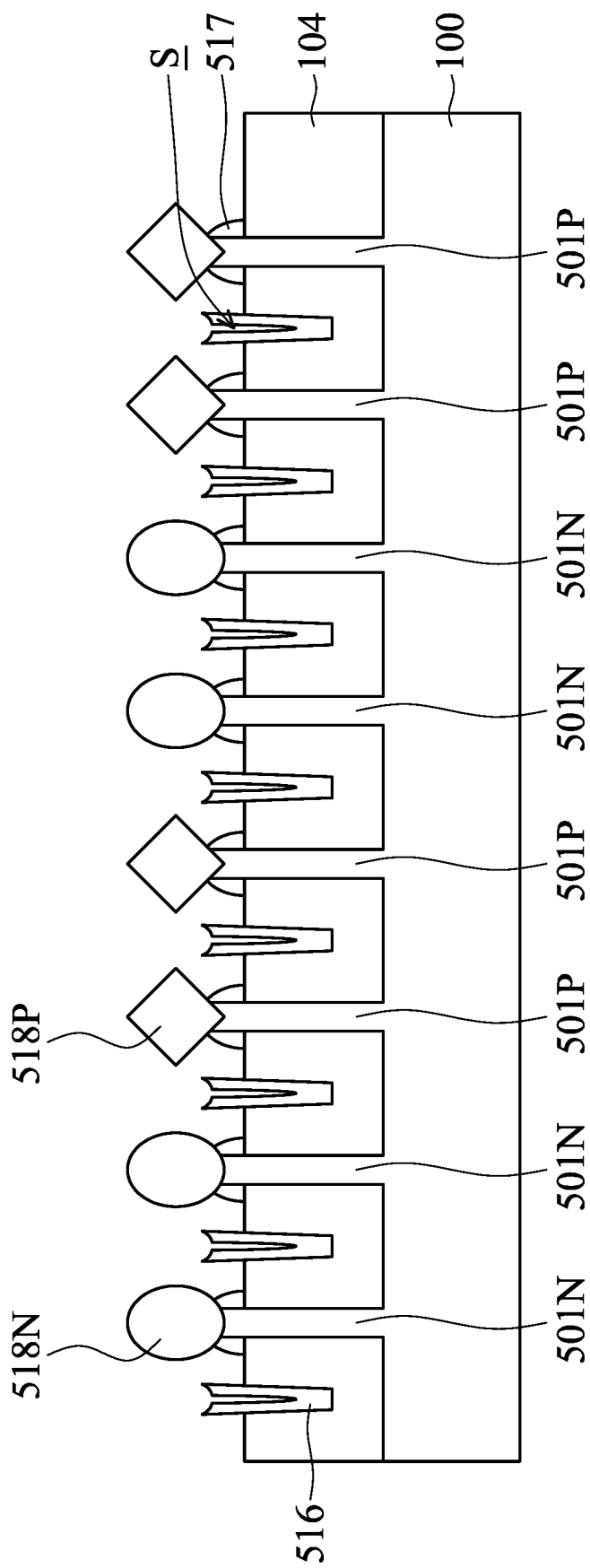
FIG. 6 is a cross-sectional view of an intermediate stage of a process for forming a portion of a semiconductor device structure, in accordance with some embodiments.

Many variations and/or modifications can be made to embodiments of the disclosure. FIG. 6 is a cross-sectional view of an intermediate stage of a process for forming a portion of a semiconductor device structure, in accordance with some embodiments. A structure similar to the embodiments illustrated in FIGS. 5A-5F is formed. In some embodiments, each of the dielectric fins 516 is recessed.

Embodiments of the disclosure form a semiconductor device structure with dielectric fins. Some dielectric fins are formed to be taller than other dielectric fins. Isolation structures are selectively formed over the taller dielectric fins. The isolation structures and the taller dielectric fins may together cut a metal gate stack into multiple portions that are electrically isolated from each other. Due to the taller dielectric fins, the formation of the isolation structures and metal gate stacks that surround the dielectric fins becomes easier. Therefore, the performance and reliability of the semiconductor device structure may therefore be improved.

In accordance with some embodiments, a method for forming a semiconductor device structure is provided. The method includes forming a first semiconductor fin and a second semiconductor fin over a substrate and forming a first dielectric fin and a second dielectric fin over the substrate. The first semiconductor fin is between the first dielectric fin and the second dielectric fin, and the second dielectric fin is between the first semiconductor fin and the second semiconductor fin. The method also includes removing an upper portion of the first dielectric fin. The method further includes forming an isolation structure over the second dielectric fin.

In accordance with some embodiments, a method for forming a semiconductor device structure is provided. The method includes forming a first dielectric fin and a second dielectric fin over a substrate, and the second dielectric fin is taller than the first dielectric fin. The method also includes forming a gate stack over the substrate, and the gate stack extends across the first dielectric fin and the second dielectric fin. The method further includes partially removing the gate stack such that an opening exposing the second dielectric fin is formed and forming an isolation structure in the opening.

In accordance with some embodiments, a semiconductor device structure is provided. The semiconductor device structure includes a first semiconductor structure and a second semiconductor structure over a substrate. The semiconductor device structure also includes a first dielectric fin and a second dielectric fin over the substrate. The second dielectric fin is taller than the first dielectric fin. The first semiconductor structure is between the first dielectric fin and the second dielectric fin, and the second dielectric fin is between the first semiconductor structure and the second semiconductor structure. The semiconductor device structure further includes an isolation structure over the second dielectric fin. In addition, the semiconductor device structure includes a gate stack surrounding the first semiconductor structure, the second semiconductor structure, the first dielectric fin, and the second dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first semiconductor fin and a second semiconductor fin over a substrate;
    forming a first dielectric fin and a second dielectric fin over the substrate, wherein the first semiconductor fin is between the first dielectric fin and the second dielectric fin, and the second dielectric fin is between the first semiconductor fin and the second semiconductor fin;
    removing an upper portion of the first dielectric fin; and
    forming an isolation structure over the second dielectric fin.

2. The method for forming a semiconductor device structure as claimed in claim 1, further comprising:
    forming a gate stack over the substrate, wherein the gate stack extends across the first semiconductor fin, the second semiconductor fin, the first dielectric fin, and the second dielectric fin;
    partially removing the gate stack such that an opening exposing the second dielectric fin is formed; and
    forming the isolation structure in the opening.

3. The method for forming a semiconductor device structure as claimed in claim 2, further comprising:
    removing the gate stack after the isolation structure is formed; and
    forming a metal gate stack surrounding the isolation structure, the first semiconductor fin, the second semiconductor fin, the first dielectric fin, and the second dielectric fin.

4. The method for forming a semiconductor device structure as claimed in claim 3, wherein tops of the metal gate stack and the isolation structure are level.

5. The method for forming a semiconductor device structure as claimed in claim 1, further comprising:
    forming a third dielectric fin over the substrate, wherein the third dielectric fin is wider than each of the first dielectric fin and the second dielectric fin; and
    forming a second isolation structure over the third dielectric fin.

6. The method for forming a semiconductor device structure as claimed in claim 5, further comprising:
    removing an upper portion of the third dielectric fin before the second isolation structure is formed.

7. The method for forming a semiconductor device structure as claimed in claim 5, further comprising:
    forming a gate stack over the substrate, wherein the gate stack extends across the first semiconductor fin, the second semiconductor fin, the first dielectric fin, the second dielectric fin, and the third dielectric fin;
    partially removing the gate stack such that a first opening and a second opening respectively exposing the second dielectric fin and the third fin are formed; and
    forming the isolation structure and the second isolation structure in the first opening and the second opening, respectively.

8. The method for forming a semiconductor device structure as claimed in claim 7, wherein the gate stack extends across opposite sidewalls of the third dielectric fin.

9. The method for forming a semiconductor device structure as claimed in claim 7, wherein the gate stack does not extend across opposite sidewalls of the third dielectric fin.

10. The method for forming a semiconductor device structure as claimed in claim 1, further comprising:
    partially removing the first dielectric fin and the second dielectric fin such that a topmost surface of the second dielectric fin is higher than a topmost surface of the first dielectric fin;
    forming a first epitaxial structure over the first semiconductor fin after the first dielectric fin and the second dielectric fin are partially removed; and
    forming a second epitaxial structure over the second semiconductor fin.

11. A method for forming a semiconductor device structure, comprising:
    forming a first dielectric fin and a second dielectric fin over a substrate, wherein the second dielectric fin is taller than the first dielectric fin;
    forming a gate stack over the substrate, wherein the gate stack extends across the first dielectric fin and the second dielectric fin;
    partially removing the gate stack such that an opening exposing the second dielectric fin is formed; and
    forming an isolation structure in the opening.

12. The method for forming a semiconductor device structure as claimed in claim 11, further comprising:
    removing the gate stack after the isolation structure is formed; and
    forming a metal gate stack to surround the first dielectric fin, the second dielectric fin, and the isolation structure.

13. The method for forming a semiconductor device structure as claimed in claim 11, further comprising:
    forming a third dielectric fin over the substrate, wherein the third dielectric fin is wider than each of the first dielectric fin and the second dielectric fin;
    recessing the third dielectric fin; and
    forming a second isolation structure over the third dielectric fin after the recessing of the third dielectric fin.

14. The method for forming a semiconductor device structure as claimed in claim 13, further comprising:
    partially removing the gate stack such that a second opening exposing the third dielectric fin is formed; and
    forming the second isolation structure in the second opening.

15. The method for forming a semiconductor device structure as claimed in claim 13, wherein the gate stack partially covers the third dielectric fin.

16. A semiconductor device structure, comprising:
    a substrate;
    a first semiconductor structure and a second semiconductor structure over the substrate;
    a first dielectric fin and a second dielectric fin over the substrate, wherein the second dielectric fin is taller than the first dielectric fin, and the first semiconductor structure is between the first dielectric fin and the second dielectric fin, and the second dielectric fin is between the first semiconductor structure and the second semiconductor structure;
    an isolation structure over the second dielectric fin; and
    a gate stack surrounding the first semiconductor structure, the second semiconductor structure, the first dielectric fin, and the second dielectric fin.

17. The semiconductor device structure as claimed in claim 16, further comprising:
    a third dielectric fin over the substrate; and a second isolation structure over the third dielectric fin, wherein the second isolation structure is taller than the isolation structure.

18. The semiconductor device structure as claimed in claim 17, wherein the third dielectric fin is wider than the second dielectric fin, and the third dielectric fin is shorter than the second dielectric fin.

19. The semiconductor device structure as claimed in claim 16, further comprising:
   a first epitaxial structure over the first semiconductor structure; and
   a second epitaxial structure over the second semiconductor structure, wherein the second dielectric fin has a first sidewall facing the first epitaxial structure and a second sidewall facing the second epitaxial structure, and the first sidewall is a recessed sidewall.

20. The semiconductor device structure as claimed in claim 19, wherein the first epitaxial structure is an n-type doped epitaxial structure.

* * * * *